United States Patent [19]

Sawada et al.

[11] Patent Number: 5,511,029
[45] Date of Patent: Apr. 23, 1996

[54] TEST CIRCUIT IN CLOCK SYNCHRONOUS SEMICONDUCTOR MEMORY DEVICE

[75] Inventors: Seiji Sawada; Yasuhiro Konishi, both of Hyogo, Japan

[73] Assignee: Mitsubishi Denki Kabushiki Kaisha, Tokyo, Japan

[21] Appl. No.: 246,582

[22] Filed: May 19, 1994

[30] Foreign Application Priority Data

May 25, 1993 [JP] Japan .................................. 5-122439

[51] Int. Cl.⁶ ...................................................... G11C 7/00
[52] U.S. Cl. ............................................. 365/201; 365/233
[58] Field of Search ..................................... 365/201, 200, 365/189.02, 189.05, 233, 230.03

[56] References Cited

U.S. PATENT DOCUMENTS 4,424,581  1/1984  Kawai ...................................... 365/201
5,311,519  5/1994  Getzlaff ................................ 365/189.02
5,313,424  5/1994  Adams ..................................... 365/201
5,355,342  10/1994  Veoka ..................................... 365/201
5,367,488  11/1994  An ...................................... 365/230.03

*Primary Examiner*—David C. Nelms
*Assistant Examiner*—A. Zarabian
*Attorney, Agent, or Firm*—Lowe, Price, LeBlanc & Becker

[57] ABSTRACT

In order to reduce a test time for a synchronous type memory device, a compression circuit compresses a plurality of memory cell data which are inputted in a plurality of read registers provided for a data output terminal to 1-bit data. A bank selection circuit selects an output of the compression circuit of either a bank #A or a bank #B. A tristate inverter buffer passes the 1-bit compression data selected by the bank selection circuit in accordance with a test mode command signal. The data output terminal outputs compressed data of a plurality of bits of memory cells. Thus, it is possible to simultaneously determine pass/fail of a plurality of memory cells, thereby reducing the test time.

33 Claims, 29 Drawing Sheets

FIG. 5
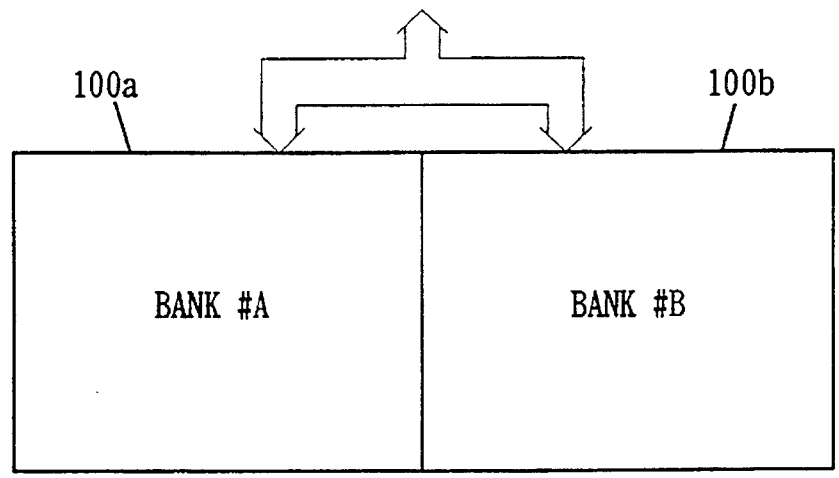
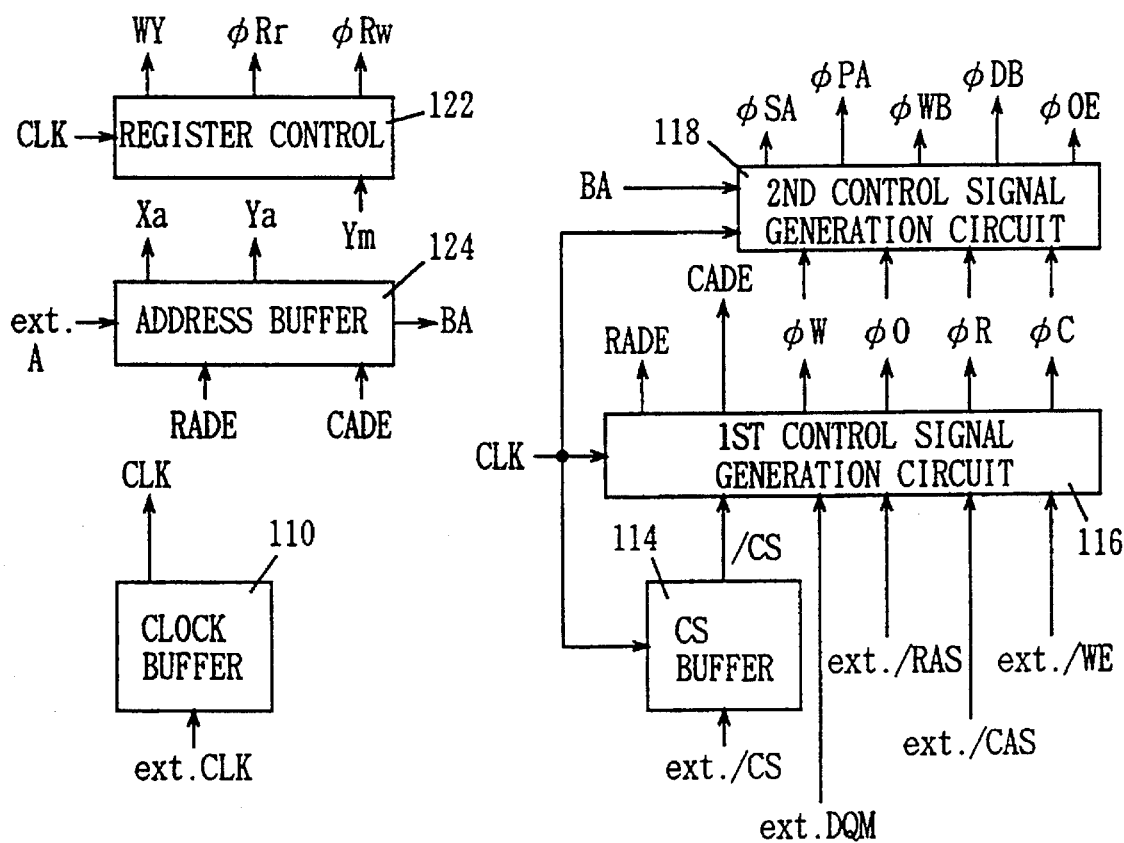
PH

FIG. 7

| FUNCTION | /CS | /RAS | /CAS | /WE | DQM |
|---|---|---|---|---|---|
| ROW ADDRESS STROBE AND ARRAY ACTIVATION | L | L | H | H | — |
| COLUMN ADDRESS STROBE AND READ | L | H | L | H | — |
| COLUMN ADDRESS STROBE AND WRITE | L | H | L | L | — |
| PRECHARGE / SELF REFRESH END | L | L | H | L | — |
| REFRESH / SELF REFRESH START | L | L | L | H | — |
| SET MODE REGISTER | L | L | L | L | — |
| WRITE ENABLE / OUTPUT ENABLE | — | — | — | — | L |
| WRITE MASK / OUTPUT DISABLE | — | — | — | — | H |
| NO CHANGE | L | H | H | H | — |
| IGNORE /RAS, /CAS & /WE | H | X | X | X | — |

FIG. 9
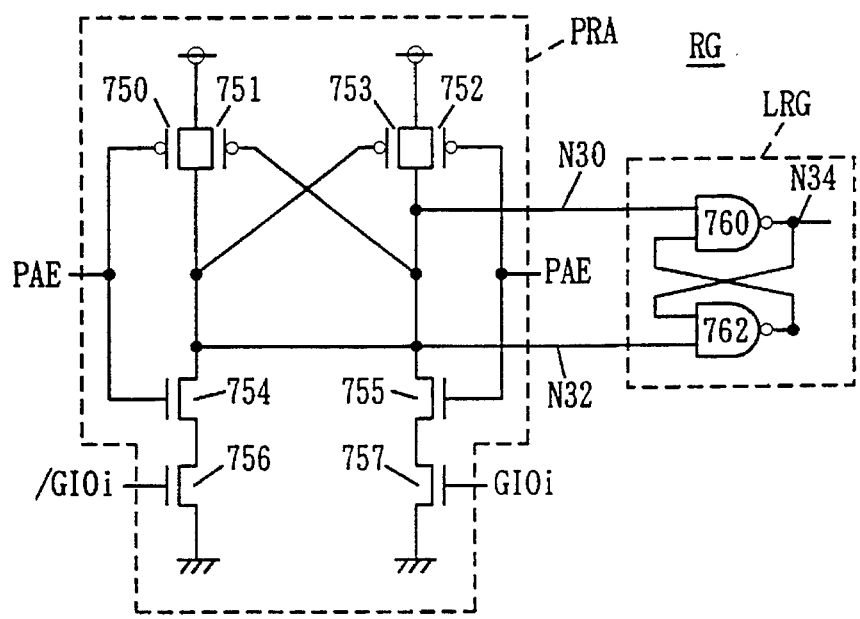
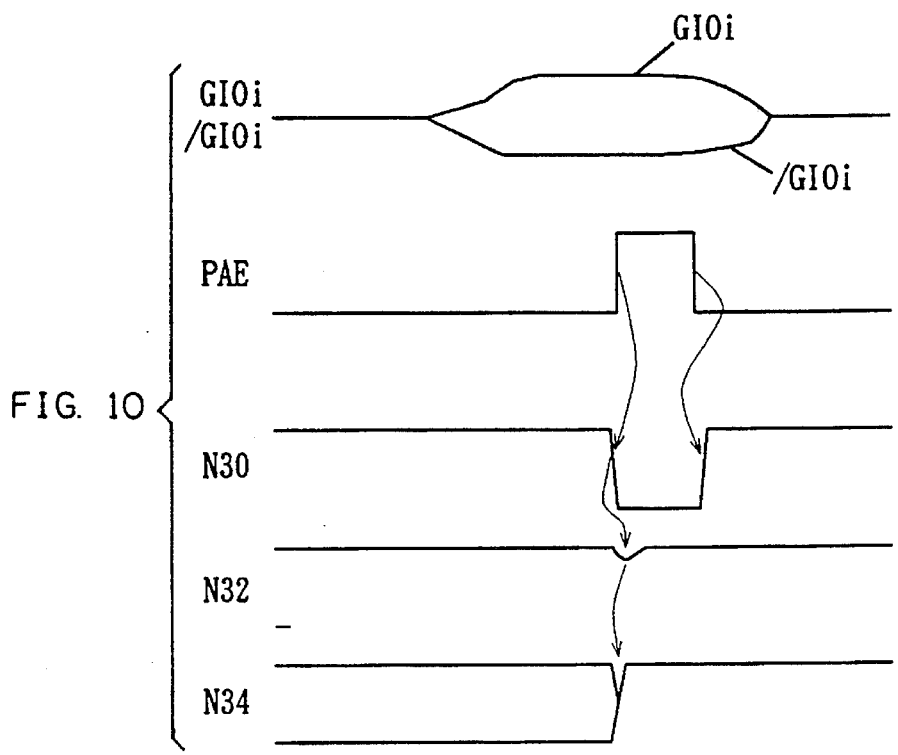
FIG. 10

|  | /RDT N/P <0:7> | NO1 | NO2 | DDFT | DECISION |
|---|---|---|---|---|---|
| PRECHARGE | L/H | H | L | – | – |
| ALL "H" | L | H | H | H | PASS |
| ALL "L" | H | L | L | H | PASS |
| "H" AND "L" | H & L | L | H | L | FAIL |

FIG. 37
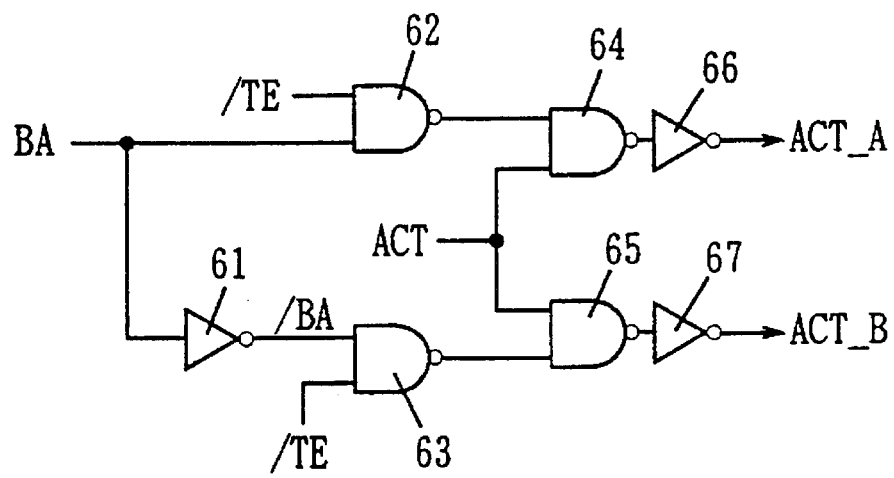
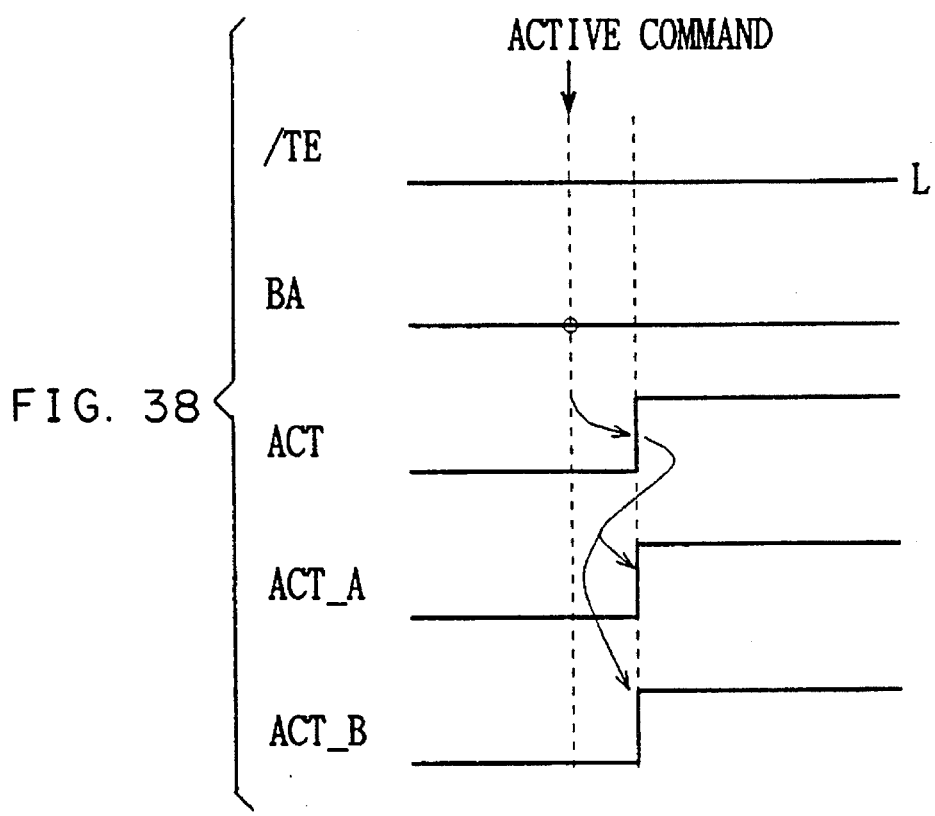
FIG. 38

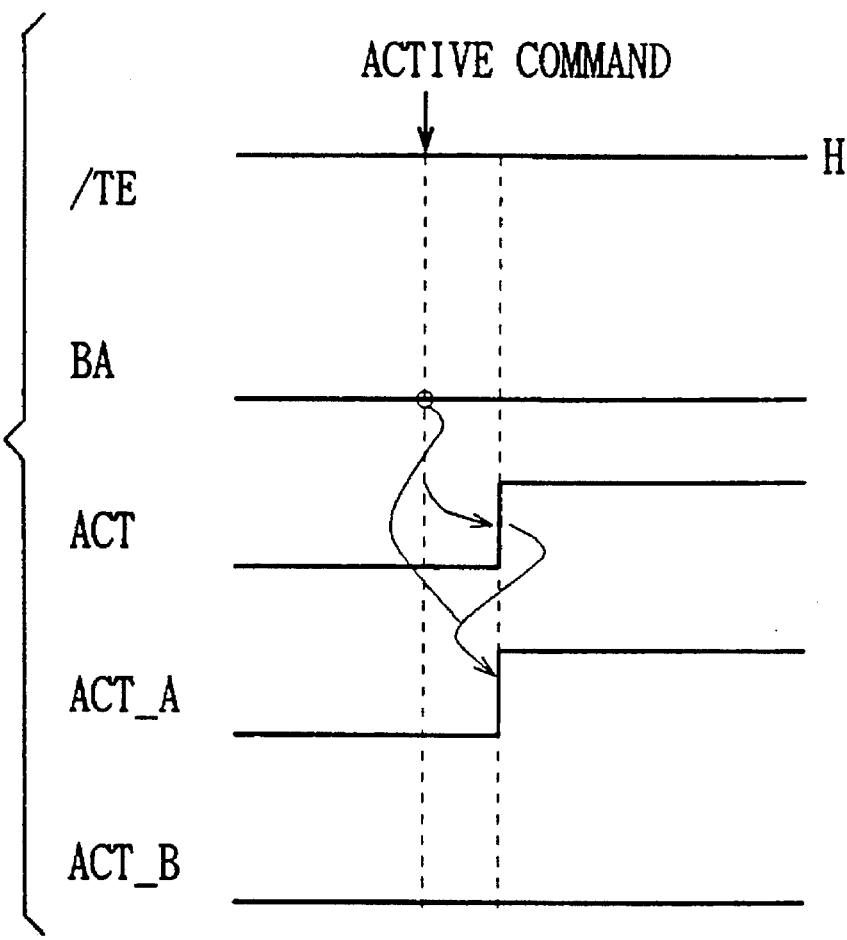

TEST CIRCUIT IN CLOCK SYNCHRONOUS SEMICONDUCTOR MEMORY DEVICE

BACKGROUND OF THE INVENTION

1. Field of the Invention

The present invention relates to a synchronous semiconductor memory device which takes in external signals including an external control signal, an address signal, write data and the like in synchronization with a clock signal formed of a series of pulses, and more particularly, it relates to a structure for easily making a test for deciding defectiveness/nondefectiveness of memory cells at a high speed.

2. Description of the Background Art

The operating speed of a microprocessor (MPU) has been increased in recent years. On the other hand, a dynamic random access memory (hereinafter referred to as DRAM) which is employed as a main memory cannot follow the MPU in operating speed although its operation has also been speeded up. Thus, it is frequently pointed out that access and cycle times of such a DRAM bottleneck the operation of the overall system, to deteriorate its performance.

In order to improve performance of such a system, frequently employed is a technique of arranging a high-speed memory called a cache memory, which is formed of a high-speed static random access memory (hereinafter referred to as SRAM) between a DRAM and an MPU. This high-speed cache memory is adapted to store frequently-used data, and accessed when the cache stores data required by the MPU. The DRAM is accessed only when the cache memory stores no data required by the MPU. Due to the high-speed cache memory storing frequently-used data, it is possible to extremely reduce frequency of access to the DRAM, thereby eliminating influences by the access and cycle times of the DRAM and improving performance of the system.

However, the SRAM is so high-priced, as compared with the DRAM, that the method employing a cache memory is unsuitable for a relatively low-priced device such as a personal computer. Thus, awaited is improvement in performance of such a system with a low-priced DRAM.

A synchronous DRAM (hereinafter referred to as SDRAM) which operates in synchronization with a high-speed external clock signal such as a system clock signal, for example, is proposed at present as one of DRAMs operating at high speeds. JEDEC (Joint Electron Device Engineering Council) of the U.S.A. employs such an SDRAM as a main memory for a high-speed MPU, and is now in operation for standardizing the specification thereof. While the standard specification is not yet clarified in detail, the following structure is proposed at present:

(1) The SDRAM is synchronized with a clock signal having a cycle of 10 to 15 ns (nanoseconds).
(2) The first data is randomly accessed with 4 to 6 clock delay after a row address signal is inputted. Thereafter data of continuous addresses can be accessed every clock.
(3) Circuits provided in a chip are pipeline-driven while serial input/output buffers are provided in a data input/output portion to reduce an access time.

However, the aforementioned structure is a mere proposal, and no means for implementing this structure is described specifically.

On the other hand, another proposal has also been made as to provision of a test mode for deciding defectiveness/nondefectiveness of the SDRAM. As to a method of and a structure for carrying out such a test, however, no definition is made specifically.

SUMMARY OF THE INVENTION

An object of the present invention is to provide an SDRAM which can efficiently make a test.

Another object of the present invention is to provide a semiconductor memory device which can efficiently make a test in a short time.

Further object of the present invention is to provide an SDRAM in which a plurality of memory cells are simultaneously tested without additional complicated circuit arrangement.

An SDRAM according to the present invention includes a data output terminal, read circuitry for simultaneously reading data from a predetermined plurality of memory cells in response to a read mode command for successively transferring the data to the data output terminal, and compression means for carrying out prescribed arithmetic operations on the data which are read from the plurality of memory cells by the read circuitry in response to a test mode command for compressing the same to 1-bit data and outputting the same.

1-bit compression may be executed on respective IO pins. Alternatively, test results of all IO pins may be compressed to 1-bit data, to be outputted from a particular IO pin.

According to the present invention, data which are read from a plurality of simultaneously selected memory cells are compressed to 1-bit data by the compression circuitry to be outputted. Thus, it is possible to simultaneously test a plurality of memory cells, thereby reducing the test time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing a structure of control signal generation circuitry of the SDRAM to which the present invention is applied;

FIG. 7 shows relation between states of external control signals and correspondingly specified operation modes in the SDRAM to which the present invention is applied;

FIG. 9 illustrates an exemplary structure of a read register shown in FIG. 8;

FIG. 10 is a signal waveform diagram showing operations of the read register shown in FIG. 9;

FIG. 37 illustrates an exemplary structure of a selective activation circuit for bringing both banks into activated states in a test mode operation;

FIG. 38 is a signal waveform diagram showing operations of the selective activation circuit shown in FIG. 37 in a test mode; and FIG. 39 is a signal waveform diagram showing operations of the selective activation circuit shown in FIG. 37 in an ordinary operation mode.

DESCRIPTION OF THE PREFERRED EMBODIMENTS

[Chip Layout]

Figure 1:
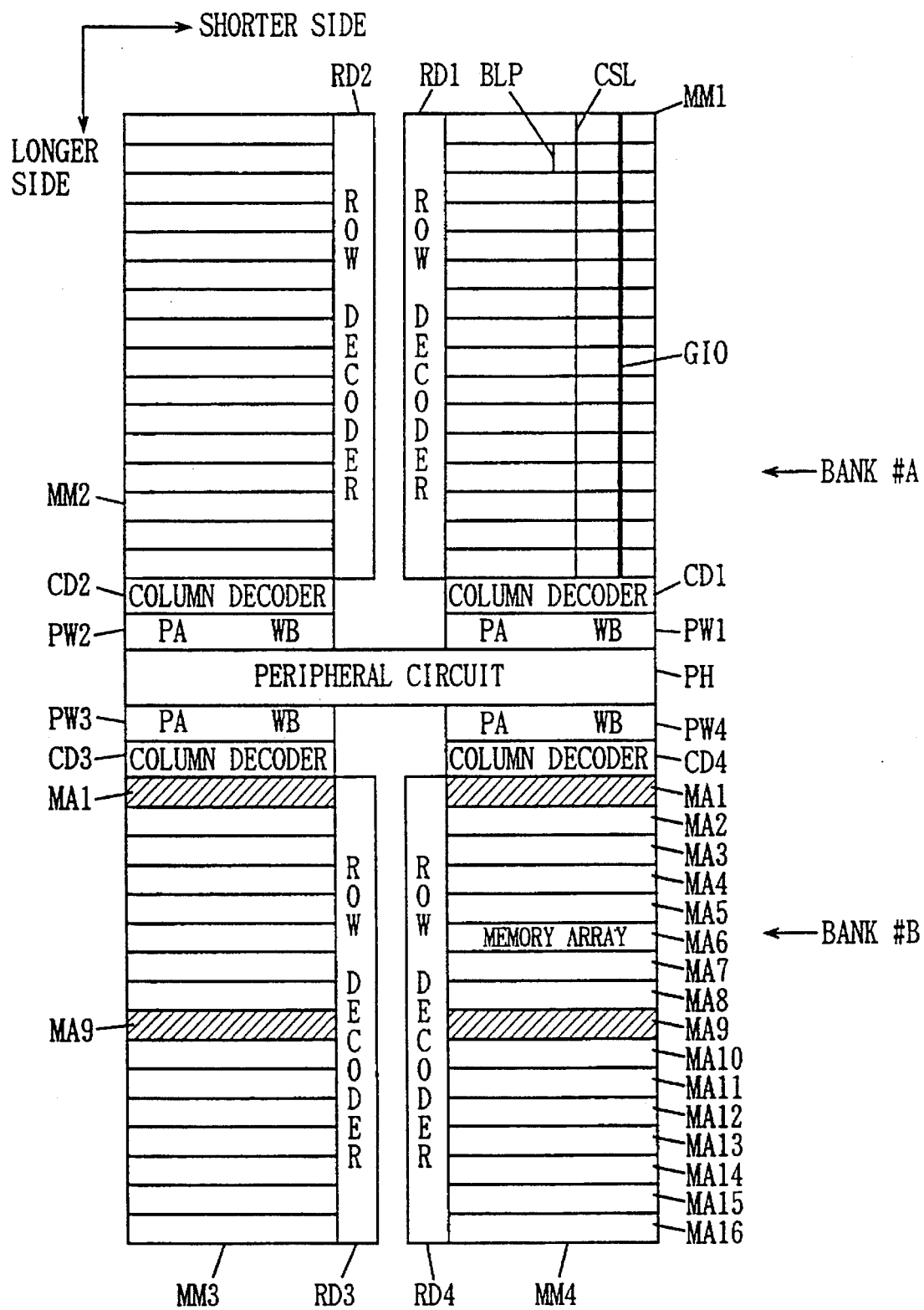
FIG. 1 illustrates a chip layout of an SDRAM to which the present invention is applied.

FIG. 1 illustrates a chip layout of an SDRAM to which the present invention is applied. FIG. 1 shows a chip layout of a 16-megabit SDRAM having a 2M word by 8 bit structure. This SDRAM includes four memory mats MM1 to MM4, each having 4-megabit storage capacity. Each of the memory mats MM1 to MM4 includes 16 memory arrays MA1 to MA16 each having 256-k bit storage capacity.

Row decoders RD1 to RD4 are arranged on respective one sides of the memory mats MM1 to MM4 along a chip longer side.

Further, column decoders CD1 to CD4 are arranged on chip center sides of the memory mats MM1 to MM4 along chip shorter side respectively. Outputs of the column decoders CD (symbol CD is adapted to genericly indicate the column decoders CD1 to CD4) are provided onto column selection lines CSL extending across the respective arrays of the corresponding memory mat MM (symbol MM genericly indicates the memory mats MM1 to MM4). Each column selection line CSL simultaneously brings eight bit line pairs BLP into a selected state.

Global IO line pairs GIO for transmitting internal data are arranged across the respective arrays along the longer sides of the memory mat MM.

The respective memory mats MM1 to MM4 are further provided on the chip center sides thereof with input/output circuits PW1 to PW4, which are formed by preamplifiers PA for amplifying data of selected memory cells and write buffers WB for transmitting write data to the selected memory cells respectively.

Peripheral circuit PH including circuitry for generating address and control signals is arranged on the chip central portion.

The SDRAM shown in FIG. 1 comprises two banks #1 and #2 which can carry out precharge operations and activating operations independently of each other. The bank #1 includes the memory mats MM1 and MM2 while the bank #2 includes the memory mats MM3 and MM4, for example.

Each of the memory mats MM1 to MM4 includes two array blocks each having 2-megabit storage capacity. One of the array blocks having 2-megabit storage capacity is formed by the memory arrays MA1 to MA8, while the other 2-megabit array block is formed by the memory arrays MA9 to MA16.

A single memory array is selected at the maximum in each array block. Four memory arrays are simultaneously activated. Referring to FIG. 1, the memory arrays MA1 and MA9 in the memory mats MM3 and MM4 are activated. In other words, a single memory array is selected from each array block of each memory mat in the selected bank #1 or #2.

On the other hand, eight column selection lines CSL are simultaneously selected. Each column selection line CSL selects eight pairs of bit lines. Thus, 8×8=64 bit memory cells are selected at the same time.

The input/output circuit PW (generic indicating the input/output circuits PW1 to PW4) is employed in common for the respective memory arrays of the corresponding memory mat MM. Each input/output circuit PW includes 32 preamplifier PA and 32 write buffers WB. Namely, the overall SDRAM includes 128 preamplifiers PA and 128 write buffers WB.

Figure 2:
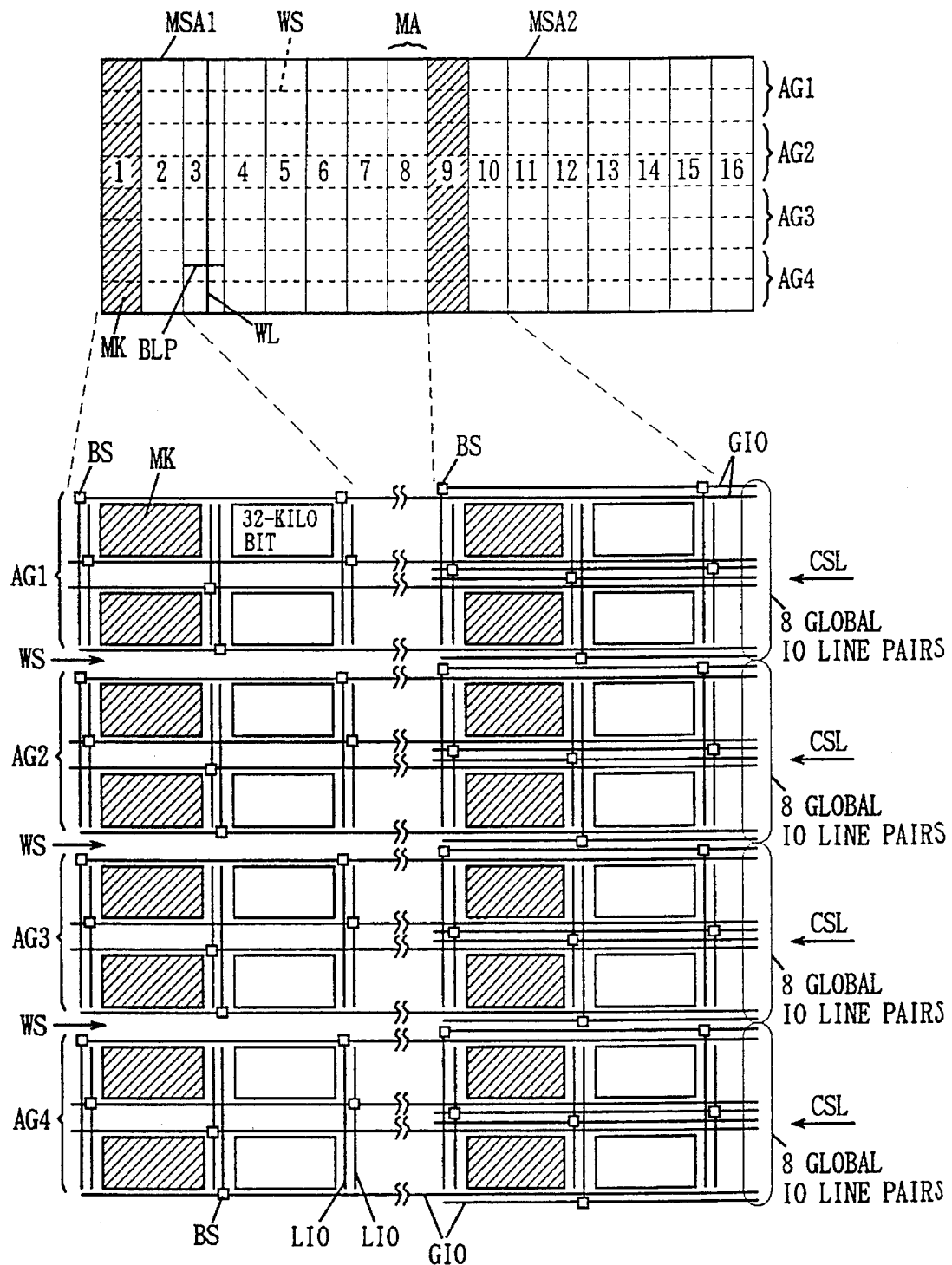
FIG. 2 illustrates arrangement of a memory array of the SDRAM shown in FIG. 1.

FIG. 2 specifically illustrates arrangement of IO lines in the SDRAM shown in FIG. 1. FIG. 2 shows two 2-megabit memory arrays MSA1 and MSA2. The 2-megabit memory array MSA1 is a 2-megabit array block which is arranged in a position away from the chip central portion, while the other memory array MSA2 is a 2-megabit array block which is close to the chip central portion.

Each of the 2-megabit memory arrays MSA1 and MSA2 includes 64 32-k bit memory arrays MK arranged in 8 rows and 8 columns. Each 2-megabit memory array MSA (this symbol genericly indicates the memory arrays MSA1 and MSA2) is divided into four array groups AG1, AG2, AG3 and AG4 along an extending direction of word lines WL. Word line shunt regions WS are provided between the 32-k bit memory arrays MK which are adjacent to each other along the word lines WL.

In an ordinary DRAM, low-resistance metal wires of aluminum or the like are arranged in parallel with word lines WL of polysilicon in order to reduce resistances of the word lines WL, so that the former are electrically connected with the latter at prescribed intervals. Regions for connecting the polysilicon word lines and the low-resistance metal wires are called word line shunt regions. In general, such low-resistance metal wires are formed above the bit lines, and the word lines are formed under the bit lines. Therefore, the word line shunt regions are provided in regions provided with no bit lines, i.e., regions provided with no memory cells, i.e., regions between the memory arrays.

The global IO line pairs GIO are arranged in the word line shunt regions WS. In the 2-megabit memory array MSA2 which is close to the chip central portion, each word line shunt region WS is provided with four global IO line pairs. Two of the four pairs of global IO lines further extend toward the 2-megabit memory array MSA1 which is away from the chip central portion. Namely, two global IO line pairs GIO are arranged on each word line shunt region of the 2-megabit memory array MSA1 which is away from the chip central portion. The two global IO line pairs GIO are used by a single 2-megabit memory array MSA in each array group AG.

Local IO line pairs LIO are provided in order to transfer data between selected memory cells and the global IO line pairs GIO. These local IO line pairs LIO are independently provided for the respective array groups AG1, AG2, AG3 and AG4. Four local IO line pairs LIO are arranged for each 32-k bit memory array MK so that two pairs are arranged on one side and the remaining two pairs are arranged on the other side.

These local IO line pairs LIO are shared by the 32-k bit memory arrays MK, belonging to the same array group AG, which are adjacent in a direction of the word lines WL, as well as the 32-k bit memory arrays MK which are adjacent in a direction of the bit lines BL.

The memory arrays MK have an alternately arranged type shared sense amplifier structure, as hereinafter described in detail. A sense amplifier is arranged in each region between each pair of 32-k bit memory arrays MK which are adjacent to each other in a direction of the bit lines BL. Block selecting switches BS are arranged in order to connect the global IO line pairs GIO with the local IO line pairs LIO. These block selecting switches BS are arranged on intersections between the word line shunt regions WS and the sense amplifier bands.

As to the column selection lines CSL for transmitting column selection signals from the column decoders CD, a single column selection line is brought into a selected state in each of the array groups AG1 to AG4. The single column selection lines CSL selects four bit line pairs BLP to connect the same to corresponding local IO line pairs LIO in the 2-megabit memory array MSA1 which is away from the chip central portion, while selecting four bit line pairs BLP to connect the same to corresponding local IO line pairs LIO in the 2-megabit memory array MSA2 which is close to the chip central portion.

Namely, the single column selection lines CSL selects eight bit line pairs BLP, to connect the same to eight global IO line pairs GIO through the local IO line pairs LIO. Two memory mats MM are activated and 8×4=32 bit line pairs BLP are selected in each memory mat MM, whereby 64 bit line pairs BLP are simultaneously selected in total so that 64-bit memory cells are simultaneously accessible in total.

Figure 3:
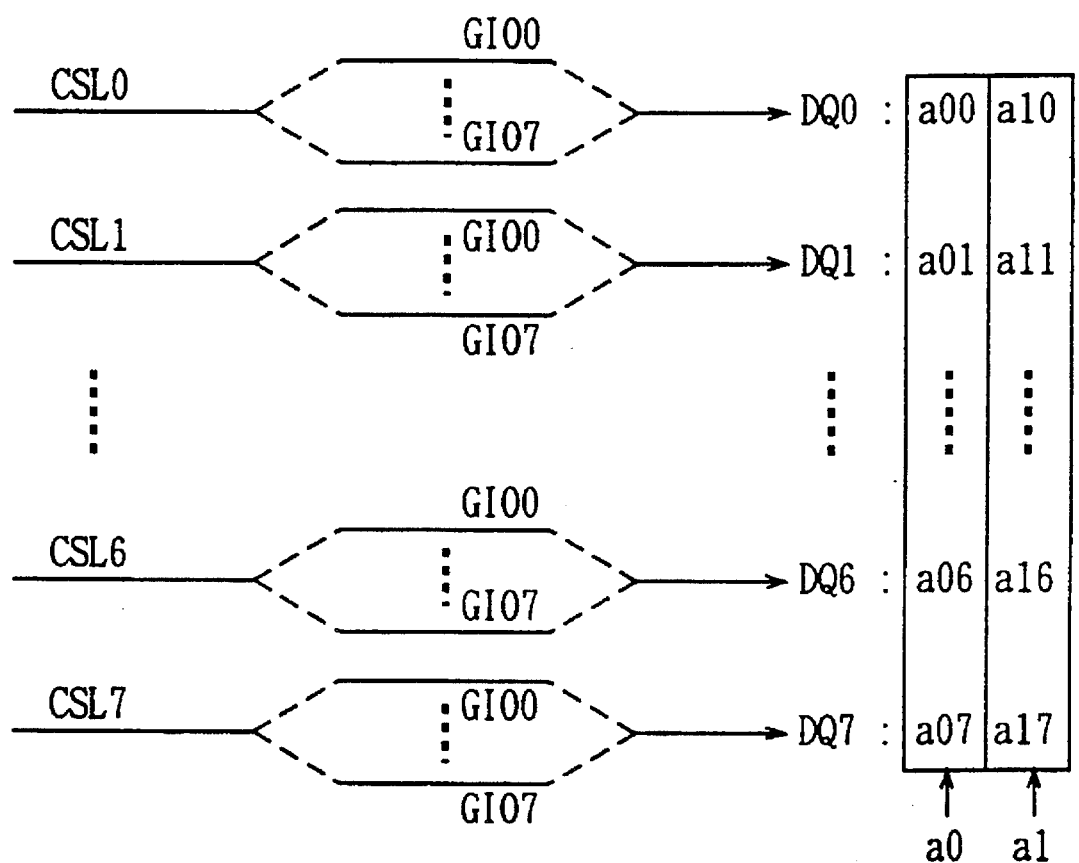
FIG. 3 illustrates correspondence between a single column selection line and data input/output terminals.

FIG. 3 illustrates exemplary correspondence between the column selection lines CSL, the global IO line pairs GIO and data input/output terminals DQ. In the example shown in FIG. 3, data are inputted/outputted in units of eight bits. Referring to FIG. 3, each column selection line CSL corresponds to one data input/output terminal DQ. In other words, eight global IO line pairs GIO0 to GIO7 which are related to a column selection line CSL correspond to one data input/output terminal. A wrap length indicates the number of continuously accessed byte data (denoted by symbols a0 and a1 in FIG. 3). This wrap length is changeable.

In the structure shown in FIG. 3, the preamplifiers (read registers) PA or the write buffers WB are successively activated in accordance with wrap addresses described later.

[Arrangement of Memory Cell]

Figure 4:
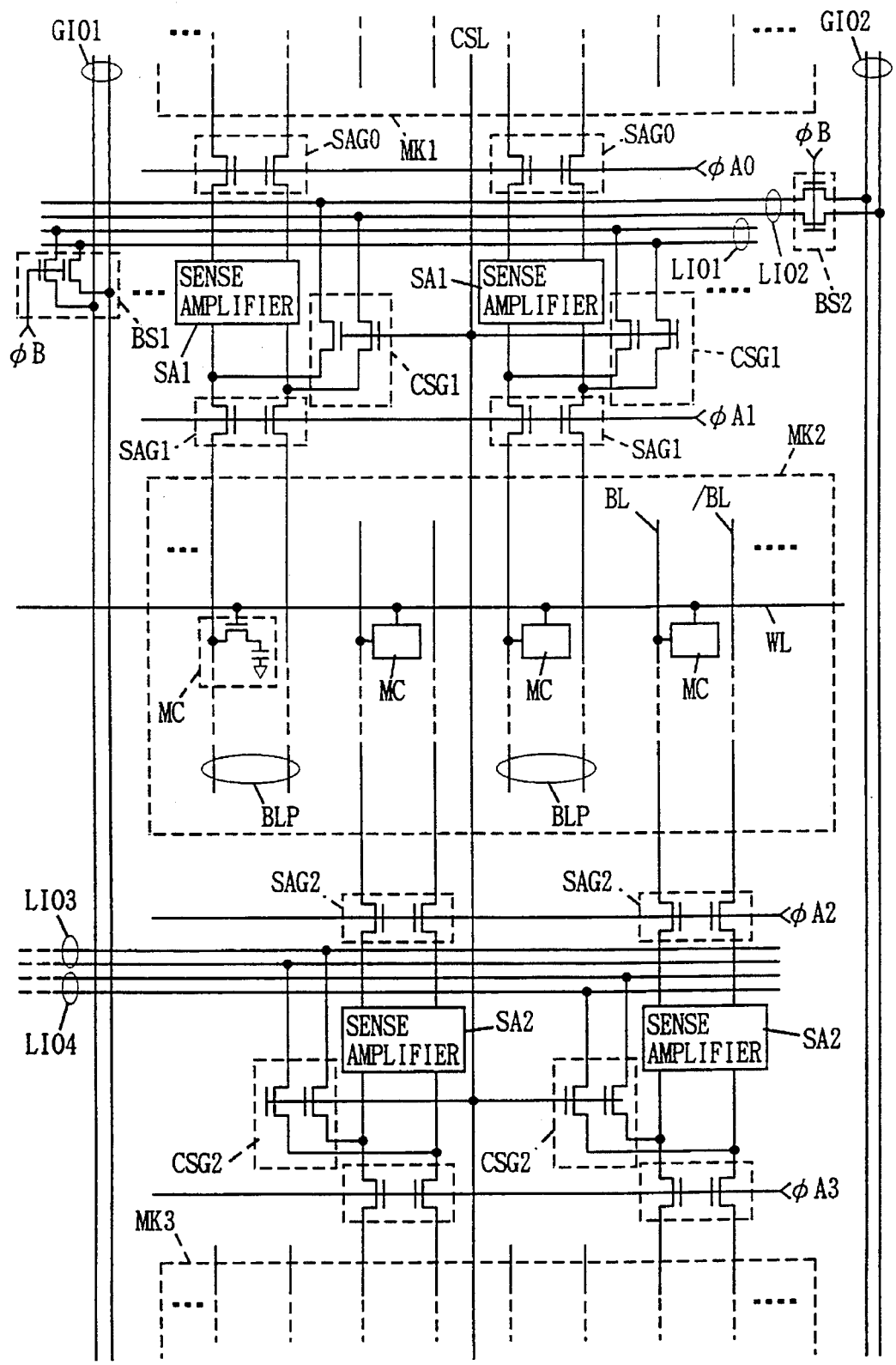
FIG. 4 illustrates internal structures of memory cell array of the SDRAM to which the present invention is applied.

FIG. 4 illustrates a structure which is related to a single 32-k bit memory array MK2. Referring to FIG. 4, the 32-k bit memory array MK2 includes a word line WL which receives a row selecting signal from the row decoder RD, bit line pairs BLP which are arranged in a direction intersecting with the word lines WL, and dynamic memory cells MC which are arranged in correspondence to intersections between the word line WL and the bit line pairs BLP.

Each memory cell MC includes an access transistor and a capacitor for storing information. Each bit line pair BLP includes bit lines BL and /BL which receive complementary signals. Referring to FIG. 4, the memory cells MC are shown being arranged in correspondence to intersections between the bit lines BL and the word line WL.

Array selector gates SAG1 and SAG2 are arranged on both sides of the memory array MK2. These array selector gates SAG1 and SAG2 are alternately arranged with respect to the bit line pairs BLP. The array selector gates SAG1 enter a conducting state in response to an array selection signal φA1, while the array selector gates SAG2 enter a conducting state in response to an array selection signal φA2. The bit line pairs BLP are connected to sense amplifiers SA1 and SA2 through the array selector gates SAG1 and SAG2 respectively.

The sense amplifiers SA1 are arranged on one side of the memory array MK2 in parallel with the word line WL, while the other sense amplifiers SA2 are arranged on the other side of the memory array MK2 in parallel with the word line WL.

Namely, these sense amplifiers SA1 and SA2 are alternately arranged with respect to the bit line pairs BLP of the memory array MK2. The sense amplifiers SA1 are shared by another memory array MK1 and the memory array MK2, while the sense amplifiers SA2 are shared by the memory array MK2 and still another memory array MK3.

Local IO line pairs LIO1 and LIO2 are arranged in parallel with the sense amplifiers SA1. On the other hand, local IO line pairs LIO3 and LIO4 are arranged in parallel with the sense amplifiers SA2. Referring to FIG. 4, two local IO line pairs are provided on either side of the sense amplifiers SA. Alternatively, the local IO line pairs may be arranged on both sides of the sense amplifiers SA.

With respect to the sense amplifiers SA1, column selector gates CSG1 are provided for transmitting data which are detected and amplified by the sense amplifiers SA1 to the local IO line pairs LIO1 and LIO2. With respect to the sense amplifiers SA2, column selector gates CSG2 are provided for transmitting data which are detected and amplified by the sense amplifiers SA2 to the local IO line pairs LIO3 and LIO4.

The column selection line CSL which receives the signal from the column decoder CD simultaneously brings the two column selector gates CSG1 and the two column selector gates CSG2 into a conducting state. Thus, four bit line pairs BLP are simultaneously connected to the local IO line pairs LIO1, LIO2, LIO3 and LIO4. The data which are detected and amplified by the sense amplifiers SA1 are transmitted to the local IO line pairs LIO1 and LIO2. On the other hand, the data which are detected and amplified by the sense amplifiers SA2 are transmitted to the local IO line pairs LIO3 and LIO4.

The block selecting switches BS for connecting the local IO line pairs LIO to the global IO line pairs GIO conduct in response to a block selection signal φB. As such block selecting switches BL, FIG. 4 shows block selecting switches BS1 and BS2 for connecting the local IO line pairs LIO1 and LIO2 to the global IO line pairs GIO1 and GIO2 respectively.

The local IO line pairs LIO3 and LIO4 are connected to two adjacent global IO line pairs GIO through the block selecting switches BS respectively (this connection is not shown in FIG. 4). The operation is now briefly stated.

When the memory array MK2 includes a selected word line WL, the array selection signals φA1 and φA2 enter active states so that the bit line pairs BLP included in the memory array MK2 are connected to the sense amplifiers SA1 and SA2. Array selector gates SAG0 and SAG3 which are provided for the memory arrays MK1 and MK3 enter a nonconducting state, while the memory arrays MK1 and MK3 maintain precharged states.

After memory cell data appear on the respective bit line pairs BLP, the sense amplifiers SA1 and SA2 are activated to detect and amplify the memory cell data.

Then, the signal on the column selection line CSL rises to a high level to enter an active state, whereby the column selector gates CSG1 and CSG2 conduct so that the data which are detected and amplified by the sense amplifiers SA1 and SA2 are transmitted to the local IO line pairs LIO1 to LIO4 respectively.

Subsequently or simultaneously the block selection signals φB enter high-level active states, so that the local IO line pairs LIO1 to LIO4 are connected to the global IO line pairs GIO1 to GIO4. In data reading, the data of the global IO line pairs GIO1 to GIO4 are amplified through the preamplifiers PA and outputted. In data writing, on the other hand, write data which are supplied from the write buffers WB are transmitted to the selected bit line pairs BLP through the global IO line pairs GIO and the local IO line pairs LIO, so that the data are written in the memory cells MC.

The block selection signals φB enter active states only for the memory array MK2 including the selected word line WL. This also applies to the array selection signals φA1 and φA2. The block selection signals φB and the array selection signals φA1 and φA2 can be generated through a prescribed number of bits (high-order four bits, for example) of a multibit row address signal.

[Bank Structure]

In the SDRAM, the memory arrays are divided into a plurality of banks, as hereinabove described. The banks must execute precharge operations and activating operations (selection of word lines, activation of sense amplifiers and the like) independently of each other. In the arrangement shown in FIG. 1, the SDRAM includes the bank #1 which is formed by the memory mats MM1 and MM2, and the bank #2 which is formed by the memory mats MM3 and MM4.

The row decoders RD and the column decoders CD are provided in correspondence to the respective memory mats MM, while internal data transmission lines (the global IO line pairs GIO and the local IO line pairs LIO) are also independently provided for the respective memory mats MM, to satisfy conditions for such banks.

In the arrangement shown in FIG. 1, further, the input/output circuits PW including the preamplifiers PA and the write buffers WB are also provided for the respective memory mats MM, whereby it is also possible to implement an interleave operation of alternately accessing the banks #1 and #2.

In other words, it is possible to precharge the bank #2 while accessing the bank #1, for example. In this case, the bank #2 can be accessed with no precharge time. It is possible to eliminate time loss caused by precharging, which is required in a DRAM before access, by accessing and precharging the banks #1 and #2 alternately, thereby implementing high-speed access.

[Internal Control Signal Generation Circuitry]

FIG. 5 is a block diagram schematically showing a structure of internal control signal generation circuitry of the SDRAM to which the present invention is applied. The internal control signal generation circuitry shown in FIG. 5 is included in the peripheral circuits PH shown in FIG. 1. Referring to FIG. 5, a memory array includes a first bank (bank #A) 100a and a second bank (bank #B) 100b. The banks 100a and 100b include the column decoders CD, the row decoders RW and the input/output circuits PW shown in FIG. 1.

FIG. 5 shows internal control signals which are generated in common for the banks 100a and 100b, in order to avoid complication of illustration. In an ordinary operation, only one of the banks 100a and 100b is activated in accordance with a bank address signal BA, so that active control signals are supplied to only the activated bank 100a or 100b.

Referring to FIG. 5, internal control circuitry (peripheral circuitry PH) includes a CS buffer 114 which buffers an external control signal ext./CS and generates an internal control signal /CS, and a clock buffer 110 which buffers an external clock signal ext.CLK and generates an internal clock signal CLK. The external control signal ext./CS is a chip selection signal which indicates selection of this SDRAM. The SDRAM enters an operable state when the signal ext./CS enters a low-level active state.

The peripheral circuit PH further includes a first control signal generation circuit 116 which is activated in response to the internal control signal /CS received from the CS buffer 114 to take in external control signals ext./RAS, ext./CAS, ext./WE and ext.DQM and generate various internal control signals, and a second control signal generation circuit 118 which generates various control signals for driving a selected array or bank in response to the control signals received from the first control signal generation circuit 116 and the bank address signal BA.

The first control signal generation circuit 116 takes in the external control signals ext./RAS, ext./CAS and ext./WE in response to the internal clock signal CLK to determine a specified operation mode along combination of the states of the control signals. In accordance with the result of this determination, the first control signal generation circuit 116 generates a write control signal φW, a read control signal φO, a row selection control signal φR, a column selection control signal φC, a row address buffer activation signal RADE and a column address buffer activation signal CADE. The first control signal generation circuit 116 further takes in the circuit control signal ext.DQM on a leading edge of the internal clock signal CLK, to enable an input/output buffer.

The second control signal generation circuit 118 receives the internal clock signal CLK and the bank address signal BA, to generate a sense amplifier activation signal φSA, a preamplifier activation signal φPA, a write register activation signal φWB, an input buffer activation signal φDB and an output buffer enable signal φOE.

The control signals φWB, φDB and φOE are generated from the second control signal generation circuit 118 along a prescribed count number (latency) of the internal clock signal CLK.

The peripheral circuit PH further includes an address buffer 124 which is activated in response to the row address buffer activation signal RADE and the column address buffer activation signal CADE received from the first control signal generation circuit 116 to take in an external address signal ext.A as a row address signal and a column address signal respectively and generate an internal row address signal Xa, an internal column address signal Ya and the bank address signal BA, and a register control circuit 122 which operates in response to the internal clock signal CLK to receive a predetermined bit of a column address signal Ym from the address buffer 124 and generate signals for controlling operations of read and write registers (described later) included in the input/output circuits PW, i.e., a wrap address WY, a read register driving signal φRr and a write register driving signal φRW.

Under control by the register control circuit 122, a plurality of read registers and a plurality of write registers provided for each data input/output terminal are selected and have operation thereof controlled.

Figure 6:
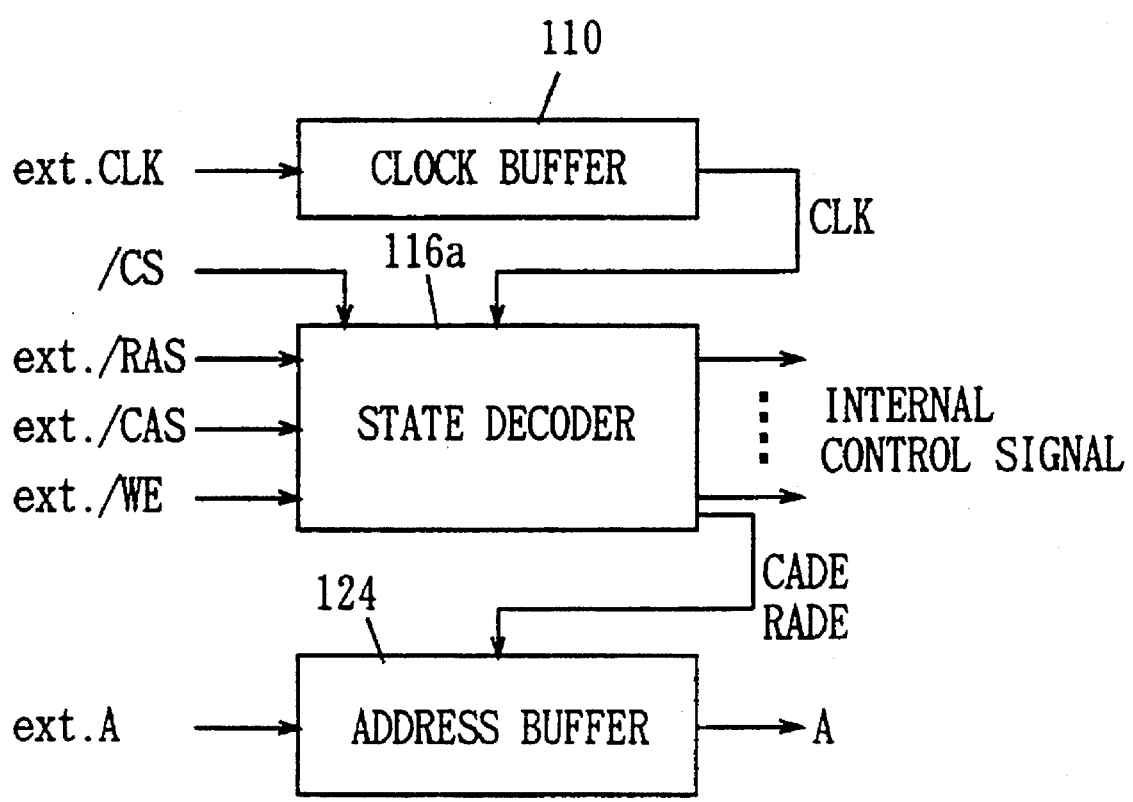
FIG. 6 schematically illustrates a structure of a first control signal generation circuit shown in FIG. 5.

FIG. 6 illustrates an internal structure of the first control signal generation circuit 116 shown in FIG. 5. As shown in FIG. 6, the first control signal generation circuit 116 includes a state decoder 116a which is activated in response to the internal control signal /CS to determine states of the external control signals ext./RAS, ext./CAS and ext./WE on a leading edge of the clock signal CLK received from the clock buffer 110. This state decoder 116a generates required internal controls and address buffer activation signals in accordance with the states of the received control signals. These external control signals ext./RAS, ext./CAS and ext./WE are supplied in the form of one-shot pulse only in a clock cycle specifying an operation mode.

[Correspondence between State of Control Signal and Operation Mode]

FIG. 7 illustrates correspondence between states of the external control signals on leading edges of the clock signal CLK and correspondingly specified operation modes. The state decoder 116a shown in FIG. 6 generates various required internal control signals so that the operations shown in FIG. 7 are executed.

(a) /CS=/RAS="L" and/CAS=/WE="H"

In this state, strobing of a row address signal as well as activation of an array are specified. Namely, this state is called an active command, and the row and bank addresses are taken in so that operations related to row selection with respect to the selected bank are executed.

(b) /CS=/CAS="L" and/RAS=/WE="H"

In this state, strobing of a column address signal and a data read operation mode are specified. This state is called a read command, and a read data register is selected so that data are transferred from selected memory cells to the read data register and successively read out.

(c) /CS=/CAS=/WE='L" and/RAS="H"

This state specifies strobing of a column address and a data write operation. This state is called a write command. When this write command is supplied, a write register is activated so that supplied data are written in the write register and selected memory cells.

At this time, a column selecting operation is executed in accordance with the strobed column address.

(d) /CS=/RAS=/WE="L" and/CAS="H"

This state is called a precharge command, in which a selected array is brought into a precharged state and termination of a self-refresh operation is specified.

(e) /CS=/RAS=/CAS="L" and/WE="H"

In this state, a refresh mode is specified and a self-refresh operation is started. In this operation mode, generation of a refresh address and a refresh operation for memory cells in a selected row are executed through a built-in address counter and a timer (not shown).

(f) /CS=/RAS=/CAS=/WE="L"

In this operation mode, data are set in a mode register. This mode register is adapted to specify an operation mode which is specific to the SDRAM, so that a desired operation is executed in accordance with the data set in this mode register. Such a mode register is used for setting of a wrap length or the like.

(g) DQM="L"

In this operation mode, a data write or read operation is executed in an operation mode (read or write mode) which is previously decided by the signals /CAS and /WE. Namely, externally supplied write data are stored in the write register or data stored in the read data register are read out.

(h) DQM="H"

In this operation mode, data reading is inactivated and a write mask operation (mask operation on continuous byte data (wrap data)). Namely, a data write/read operation is inhibited.

(i) /CS="L" and/RAS=/CAS=/WE="H"

In this state, no particular change is caused in the operation. No operation mode is specified. The SDRAM is in a selected state and in execution of a previously specified operation.

(j) /CS="H"

In this state, the SDRAM is in a non-selected state, and the signals /RAS, /CAS and /WE are ignored.

Referring to FIG. 7, signs "-" indicate "don't care" states, and symbols X indicate "arbitrary" states.

[Data Read Circuitry]

Figure 8:
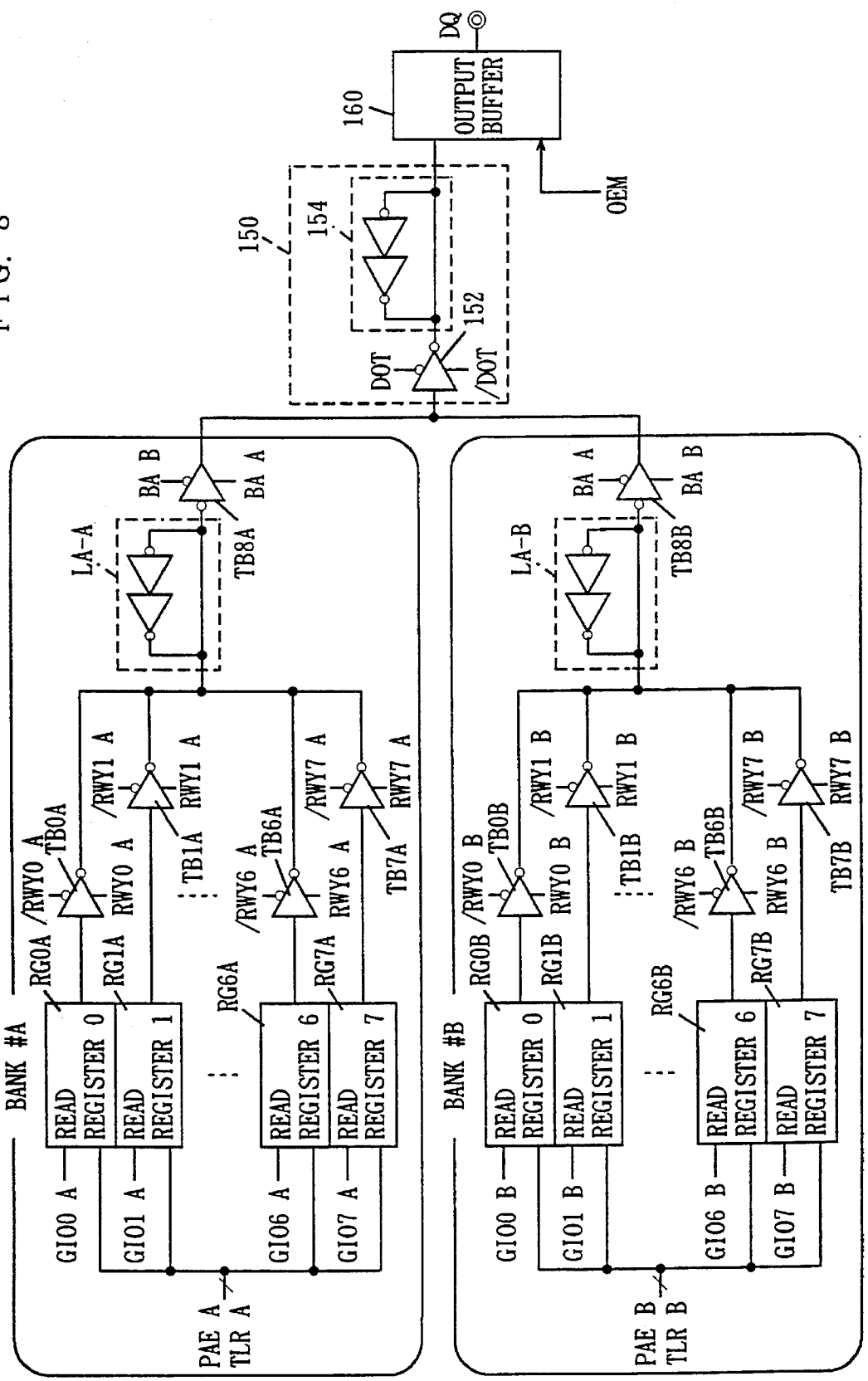
FIG. 8 illustrates structures of data read circuitry of the SDRAM to which the present invention is applied.

FIG. 8 illustrates structures of data read circuitry of the SDRAM to which the present invention is applied. Referring to FIG. 8, the SDRAM includes banks #A and #B having the same structures. FIG. 8 shows only structures of data read circuitry for a single data input/output terminal DQ. When the SDRAM has an 8-bit structure, eight structures corresponding to that shown in FIG. 8 are provided in parallel with each other.

Referring to FIG. 8, the data read circuitry of the bank #A includes read registers RG0A to RG7A which amplify and latch data on corresponding global IO line pairs GIO0A to GIO7A in accordance with a preamplifier enable signal PAEA and a transfer command signal TLRA, tristate inverter buffers TB0A to TB7A which transfer data of corresponding read registers RG0A to RG7A in accordance with wrap addresses RWYiA and /RWYiA (i=0 to 7), a latch circuit LA-A which latches an output of a selected one of the inverter buffers TB0A to TB7A, and a tristate inverter buffer TB8A which inverts and amplifies latch data of the latch circuit LA-A in accordance with bank specifying signals BAA and BAB.

The data read circuitry of the bank #B includes a structure which is similar to that of the bank #A. Read registers RG0B to RG7B amplify and latch data on corresponding global IO line pairs GIO0B to GIO7B in accordance with a preamplifier enable signal PAEB and a transfer command signal TLRB. Tristate inverter buffers TB0B to TB7B invert and amplify latch data of the corresponding read registers RG0B to RG7B in accordance with wrap addresses RWY0B,/ RWY0B to RWY7B,/RWY7B.

A latch circuit LA-B latches an output of an activated one of the tristate inverter buffers TB0B to TB7B. A tristate inverter buffer TB8B inverts and amplifies data latched by the latch circuit LA-B.

The SDRAM further includes a latch circuit 150 which latches outputs from the banks #A and #B (the tristate inverter buffers TB8A and TB8B), and an output buffer 160 which transmits an output of the latch circuit 150 to the data input/output terminal DQ in accordance with an output enable signal OEM. The output buffer 160 enters an output high impedance state when the output enable signal OEM is in a low-level inactive state.

The latch circuit 150 includes a tristate inverter buffer 152 which is activated in response to control signals DOT and /DOT, and a latch circuit 154 which latches an output of the tristate inverter buffer 152. The operations are now described.

One of the banks #A and #B is activated in accordance with the bank address BA. In other words, one of the tristate inverter buffers TB8A and TB8B enters an active state and the other one enters an inactive state. Consider that the bank #A is now activated.

Data of 8-bit memory cells are transmitted onto the global IO line pairs GIO0A to GIO7A. The read registers RG0A to RG7A store the data on the corresponding global IO line pairs GIO0A to GIO7A in accordance with the preamplifier enable signal PAEA and the transfer command signal TLRA.

Then, the wrap address signals RWY0, /RWY0 to RWY7, /RWY7 are successively activated in a prescribed order, so that the tristate inverter buffers TB0A to TB7A are successively activated in the prescribed order. The register control circuit 122 decides the order for activating the wrap address signals RWY0 to RWY7 by decoding a prescribed number of bits of the column address signal Ym which is supplied from the address buffer 124. Memory cell data outputted from the tristate inverter buffers TB0A to TB7A are latched by the latch circuit LA-A. Then, the data latched in the latch circuit LA-A is stored in the latch circuit 154 in accordance with the transfer signals DOT and /DOT. The data stored in the latch circuit 154 is outputted from the output buffer 160 in accordance with the output enable signal OEM.

[Read Register]

FIG. 9 illustrates an exemplary structure of each read register shown in FIG. 8. The read registers RG0A to RG7A and RG0B to RG7B are identical in structure to each other, and hence the read register appearing in FIG. 9 is denoted by symbol RG.

Referring to FIG. 9, the read register RG includes a preamplifier PRA which amplifies signal potentials on corresponding global IO lines GIOi and /GIOi in response to a preamplifier enable signal PAE (the signal PAEA or PAEB), and a latch circuit LRG which latches the data amplified by the preamplifier PRA.

The preamplifier PRA includes complimentarily connected p-channel and n-channel MOS transistors (insulated gate field-effect transistors) 750 and 754 receiving the preamplifier enable signal PAE at gates thereof, an n-channel MOS transistor 756 which is provided between the transistor 754 and a ground potential and has a gate connected to the global IO line /GIOi, complementarily connected p-channel and n-channel MOS transistors 752 and 755 receiving the preamplifier enable signal PAE at gates thereof, and an n-channel MOS transistor 757 which is provided between the transistor 755 and a ground potential and has a gate connected to the global IO line GIOi.

The preamplifier PRA further includes p-channel MOS transistors 751 and 753 which are provided in parallel with the transistors 750 and 752 respectively. Gates and drains of the transistors 751 and 753 are cross-connected with each other.

The latch circuit LRG includes a pair of two-input NAND circuits 760 and 762. The NAND circuit 760 has an input which is coupled to a node N30 (one output node of the preamplifier PRA), and another input which is coupled to an output of the NAND circuit 762. On the other hand, the NAND circuit 762 has an input which is coupled to a node N32 (another output node of the preamplifier PRA), and another input which is coupled to an output node N34 of the NAND circuit 760. The output node N34 of the NAND circuit 760 outputs the data stored in the read register RG. The operations of the read register RG shown in FIG. 9 are now described with reference to an operation waveform diagram shown in FIG. 10.

When a read command is supplied, column selection is executed in accordance with a currently supplied column address signal Ym. In the selected bank, data of selected memory cells are transmitted onto the global IO lines GIOi and /GIOi, so that signals on the global IO lines GIOi and /GIOi are changed to potentials corresponding to the read data. Referring to FIG. 10, data "1" corresponding to a high-level potential is read on the global IO line GIOi, while data "0" corresponding to a low-level potential is read on the global IO line /GIOi.

Upon ascertainment of the potentials on the global IO lines GIOi and /GIOi, the preamplifier enable signal PAE is generated when the read command is supplied, through use of the clock signal CLK as a trigger signal.

The preamplifier enable signal PAE is included in the signal φPA which is generated from the second control signal generation circuit 118 shown in FIG. 5. This preamplifier enable signal PAE is triggered to be generated on a leading edge of the clock signal CLK in advance of one clock cycle to a latency (number of clocks required for outputting valid data upon supply of the read command).

While the preamplifier enable signal PAE is at a low level, the p-channel MOS transistors 751 and 752 are in ON states and the n-channel MOS transistors 754 and 755 are in OFF states in the preamplifier PRA. Therefore, the nodes N30 and N32 are precharged at high-level potentials through the transistors 751 and 752. In this state, the latch circuit LRG remains unchanged and holds a data signal read in a previous access cycle.

When the preamplifier enable signal PAE rises to a high level, the transistors 750 and 752 enter OFF states and the transistors 754 and 755 enter ON states. The already stabilized signals on the global IO lines /GIOi and GIOi are transmitted to the gates of the transistors 756 and 757. The current signal potential on the global IO line GIOi is at "1". Therefore, conductivity of the transistor 757 goes greater than that of the transistor 756, whereby the node N30 is discharged by the transistors 755 and 757 at a higher speed than the node N32.

When the potential of the node N30 is reduced, the transistor 751 enters an ON state to charge the node N32. When the potential of the node N32 is increased, the transistor 753 enters an OFF state. Thus, the potentials of the nodes N30 and N32 reach levels corresponding to those of the global I0 lines GIOi and /GIOi at a high speed. Namely, the potentials of the nodes N30 and N32 go low and high respectively. The output of the NAND circuit 760 goes high responsibly, whereby data read from selected memory cell is latched in the node N34.

After a lapse of a prescribed period, the preamplifier enable signal PAE falls to a low level, so that the potentials of the nodes N30 and N32 go high in the preamplifier PRA and the latch circuit LRG enters a data latch state.

The wrap addresses RWYi are set in response to rise of the clock signal CLK in the first cycle of the latency upon starting of the column selecting operation (upon fall of the signal /CAS to a low level and supply of the read command). Then, the wrap addresses RWYi are successively generated in response to the clock signal CLK during clock cycles indicated by a wrap length.

These wrap addresses RWYi are generated from the register control circuit 122 shown in FIG. 5. Referring to FIG. 5, however, the wrap addresses WY are shown being supplied to both read and write registers.

Figure 11:
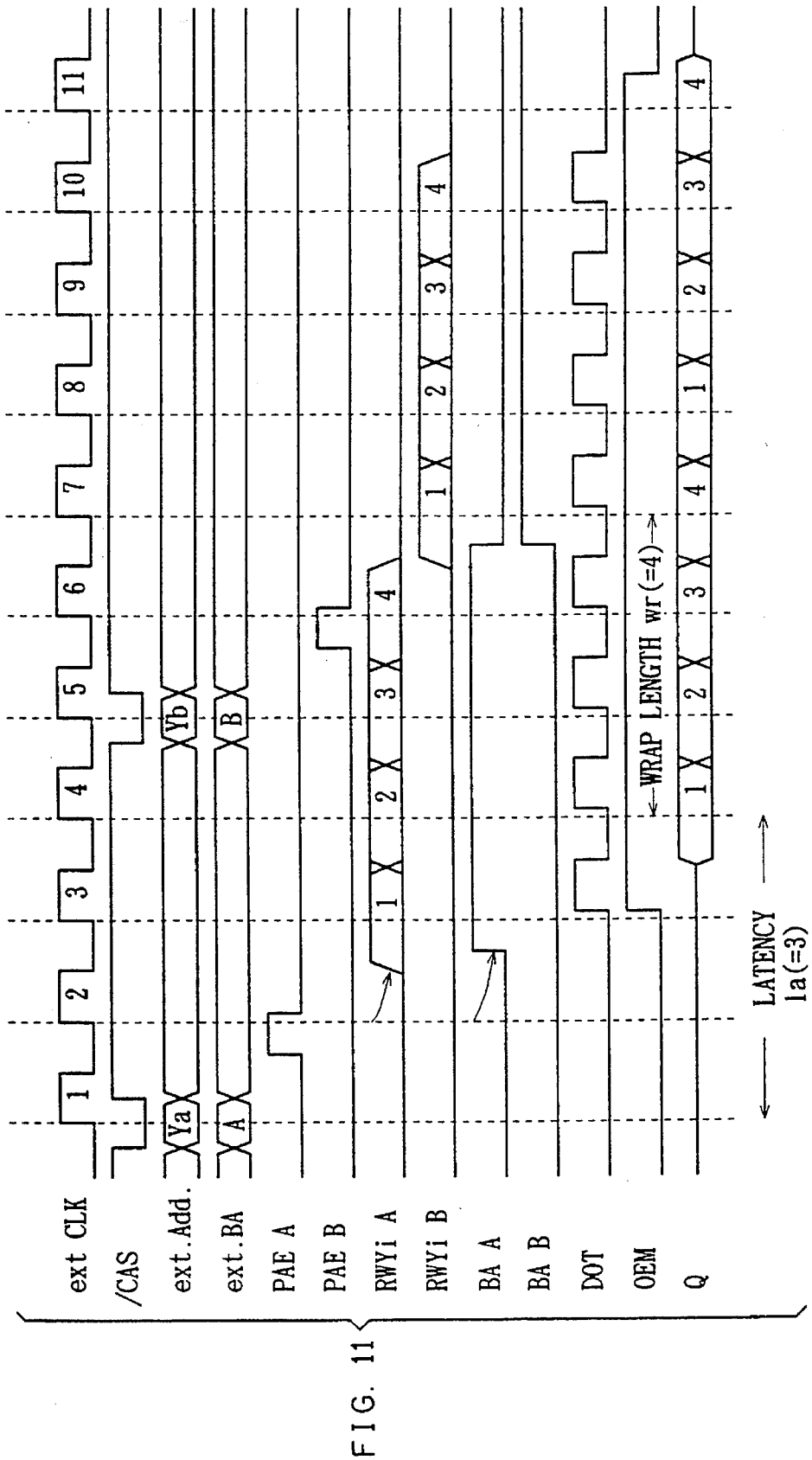
FIG. 11 is a timing chart showing operations of data read circuitry shown in FIG. 8.

The operations of each data read circuitry shown in FIG. 8 are now described with reference to an operation timing chart shown in FIG. 11. FIG. 11 shows an exemplary data read operation with a latency of 3 and a wrap length of 4.

In a first clock cycle, the signal /CAS is set at a low level on a leading edge of the clock signal CLK, to specify starting a column selecting operation. At this time, the control signals /WE and /RAS are set at high levels, to provide a read command. An active command has already been supplied and a row selecting operation is being executed in a selected bank.

An address Ya which is supplied with the read command is regarded as a column address, to execute a column selecting operation. At this time, a bank address A is set to select the bank #A. As described above, a row selecting operation is being executed in accordance with the previously supplied signal /RAS and the simultaneously supplied bank address A. Thus, this bank address A has a function of carrying out bank specification of the data read circuitry, i.e., a circuit related to the signal CAS.

In a second clock cycle, the preamplifier enable signal PAEA is set at a high level on a leading edge of the clock signal CLK. Namely, the preamplifier enable signal PAEA is activated in a (latency 2) clock cycle. Data are amplified and latched in the read register RD at a time two clock cycles ahead of valid data appearing at the data input/output terminal DQ.

In the second clock cycle, a wrap address RWY is generated from a wrap address generation circuit, which is included in the register control circuit 122 shown in FIG. 5, triggered by the leading edge of the clock signal CLK. Thus, one of the tristate inverter buffers TBOA to TB7A is activated so that data latched in a read register RGiA (latch circuit LRG) are latched by the latch circuit LA-A which is provided in front stage of the tristate inverter buffer TB8A provided in the output part.

In parallel with the generation of the wrap address RWYiA, a bank specifying signal BAA is triggered by the leading edge of the clock signal CLK, in the second clock cycle to go high. This bank specifying signal BAA is generated from the second control signal generation circuit 118 shown in FIG. 5. Thus, the data latched in the latch circuit LA-A is transmitted to a front stage of the latch circuit 150 through the tristate inverter buffer TB8A.

In a third clock cycle which is in advance of a clock cycle for outputting valid data, i.e., a latency 2, the control signal DOT goes high for a prescribed period using a leading edge of the clock signal CLK as a trigger signal. Thus, the tristate inverter buffer 152 operates to take in and latch already transmitted data by the latch circuit 154.

In synchronization with generation of the control signal DOT, the output enable signal OEM rises to a high level. Thus, the output buffer 160 is activated to transmit the data latched in the latch circuit 150 to the data input/output terminal DQ.

In the third clock cycle, the wrap address RWYi is changed on the leading edge of the clock signal CLK.

In a fourth clock cycle, the output data of the output buffer 160 are ascertained as valid data.

Thereafter the wrap address RWYiA is changed every clock cycle and the control signal DOT is generated on each leading edge of the clock signal CLK serving as a trigger signal and the output buffer 160 outputs data.

A read command for the bank #B is supplied in a fifth clock cycle. Also in this case, the preamplifier enable signal PAEB rises to a high level in a sixth clock cycle, so that data of selected memory cells are amplified and latched by the read registers RBOB to RB7B in the bank #B. Thus, it is possible to activate the banks #A and #B in parallel with each other in a pipeline manner.

After the preamplifier enable signal PAEB is generated in the bank #B, wrap addresses RWYiB are successively generated. In accordance with the wrap addresses RWYiB, data are successively transmitted to an input portion of the latch circuit 150. Thereafter the data are successively read out from a next clock cycle in accordance with the control signals DOT and OEM.

The control signal DOT goes low when the clock signal CLK is counted by a number indicated by the wrap length (4 in the structure shown in FIG. 11). Similarly to the control signal DOT, the output enable signal OEM goes low when the clock signal CLK is counted by the number indicated by the wrap length after the output enable signal OEM enters an active state.

When the latency is set at 1, the wrap address RWYi is changed through the clock signal CLK as a trigger signal, in a clock cycle in which a read command is applied. The output control signal DOT is also set at a high level in the clock cycle in which the read command is applied when the latency is 1.

Figure 12:
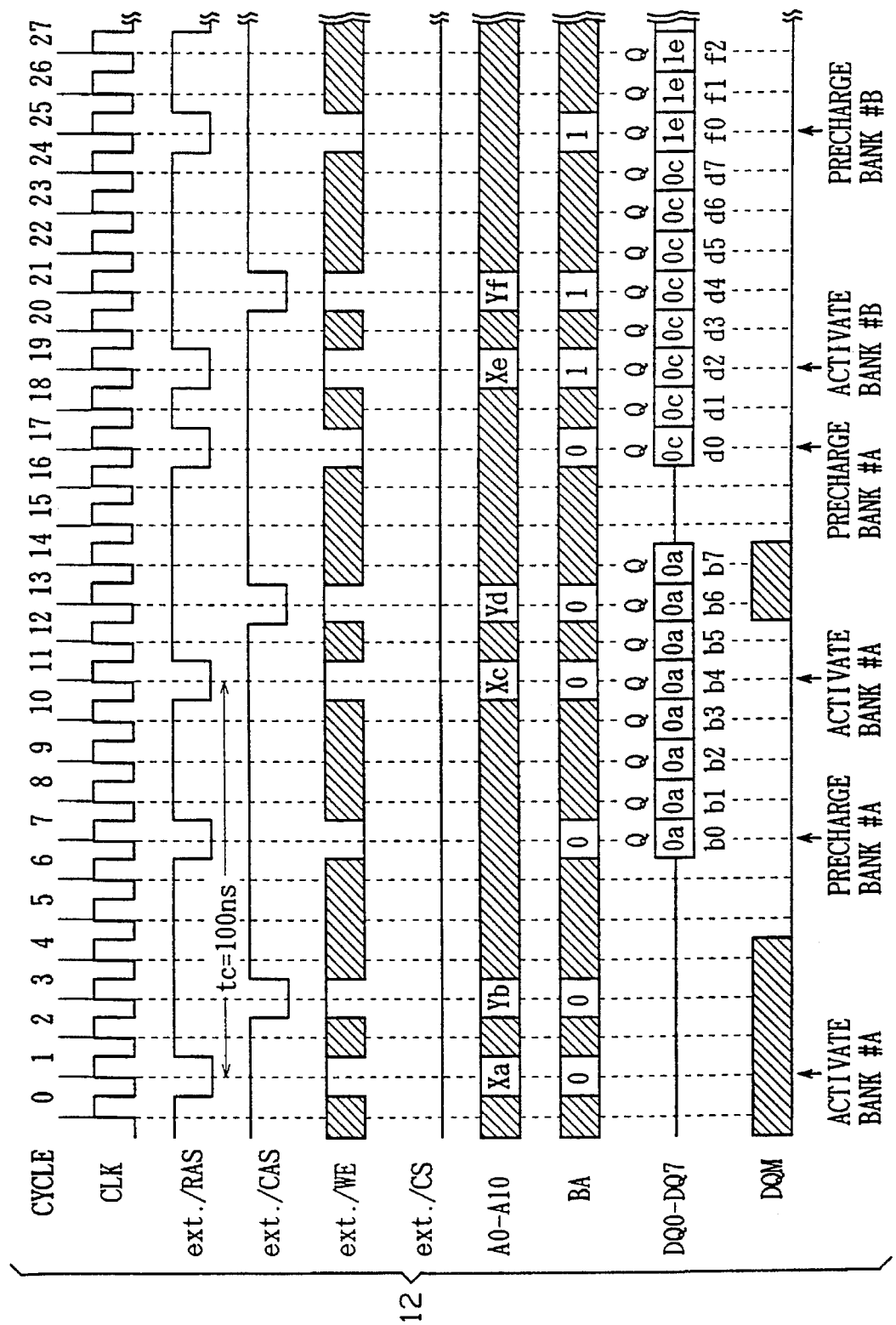
FIG. 12 illustrates states of the external control signals in data reading of the SDRAM shown in FIG. 8.

A specific data read operation of the SDRAM is now briefly described with reference to a timing chart shown in FIG. 12.

In a cycle 1, an active command is supplied on a leading edge of the clock signal CLK. Namely, the signals ext./RAS and ext./CS are set at low levels and the signals ext./CAS and ext./WE are set at high levels. In the following description, the chip selection signal ext./CS is not mentioned in particular since the same is set at a low level in operation.

In accordance with the active command, row address signal bits A0 to A10 (the address signal is assumed to be a 10-bit signal) are taken in as the row address signal Xa, so that an internal row address signal is generated. At this time, the bank address signal BA is simultaneously taken in. It is assumed here that the bank #A is specified when the bank address signal BA is "0", while the bank #B is specified when the bank address signal BA is "1". In the specified bank #A, a row selecting operation, i.e., array activation is executed.

In a clock cycle 3, a read command is supplied on a leading edge of the clock signal CLK. Namely, the signals ext./RAS and ext./WE are set at high levels, while the signal ext./CAS is set at a low level. The address signal bits A0 to A10 are taken in as a column address signal Yb on the leading edge of the clock signal CLK in this cycle 3. At this time, a bank address BA is also taken in. Thus, operations for selecting a row and a column are executed along the row and column address signals Xa and Yb in the interior, so that data of the selected memory cells are stored in the read registers. When the latency is set at 4, the data stored in the read registers are successively outputted in response to rise of the clock signal CLK in a cycle 7 after a lapse of four clocks from the supply of the read command. At this time, a signal DQ is previously set at a low level, so that a data read operation is enabled.

When the wrap length is set at 8, eight data (8-byte data) stored in the read registers are successively read out. Symbols b0 to b7 each denote the continuous 8-bit (byte) data.

In parallel with this data read operation, the signals ext./RAS and ext./WE are set at low levels and the signal ext./CAS is set at a high level on a leading edge of the clock signal CLK in the cycle 7. At the same time, the bank address BA is set at "0". Thus, a precharge operation for the bank #A is specified to precharge the arrays of the bank #A.

The bank #A entering a precharged state can be activated again after a lapse of a prescribed RAS precharge period (two or three clock cycles).

In a cycle 11, an active command for the bank #A is inputted on a leading edge of the clock signal CLK, to activate the bank #A again.

In a cycle 13, a read command for the bank #A is supplied on a leading edge of the clock signal CLK, so that the 8 byte data b0 to b7 are read from the memory array activated by the previous active command and are stored in the read registers.

Since the current latency is 4, ascertained data are outputted in synchronization with rise of the clock signal CLK in a cycle 17 after a lapse of four clocks from supply of the read command.

After the cycle 17, eight data d0 to d7 which are selected by row and column address signals Xc and Yd are successively read on leading edges of the clock signal CLK. In the cycle 17, the signals ext./RAS and ext./WE are changed to low levels and the signal ext./CAS is changed to a high level while the bank address signal BA is set to "0". Thus, the bank #A again enters a precharged state.

In a cycle 19, the signal ext./RAS is changed to a low level and the signals ext./CAS and ext./WE are changed to high levels, while the bank address signal BA is set at "1". Due to input of an active command for the bank #B, a row selecting operation is executed in the bank #B in accordance with a row address signal Xe.

A read command for the bank #B is inputted on a leading edge of the clock signal CLK in a cycle 21. Thus, 8 byte data are stored in the read registers in the bank #B.

After data D7 is read from the bank #A, data f0 is read from the bank #B on a leading edge of the clock signal CLK in a next clock cycle 25. At this time, a precharge command for the bank #B is also inputted. In the bank #B, a selected row enters a non-selected state and the memory array of bank #B returns to a precharged state. Data are read from the read registers in synchronization with the rise of the clock signal CLK.

As hereinabove described, it is possible to specify the operation mode by combining the signals ext./RAS, ext./CAS and ext./WE only in a first period of an operation cycle by applying the signal ext./RAS in the form of pulse, thereby easily switching the banks #A and #B and precharging one of the banks while activating the other bank. Therefore, it is possible to interleavingly read data from the banks #A and #B at a high speed without considering a RAS precharge time.

[Data Write Circuit Circuitry]

Figure 13:
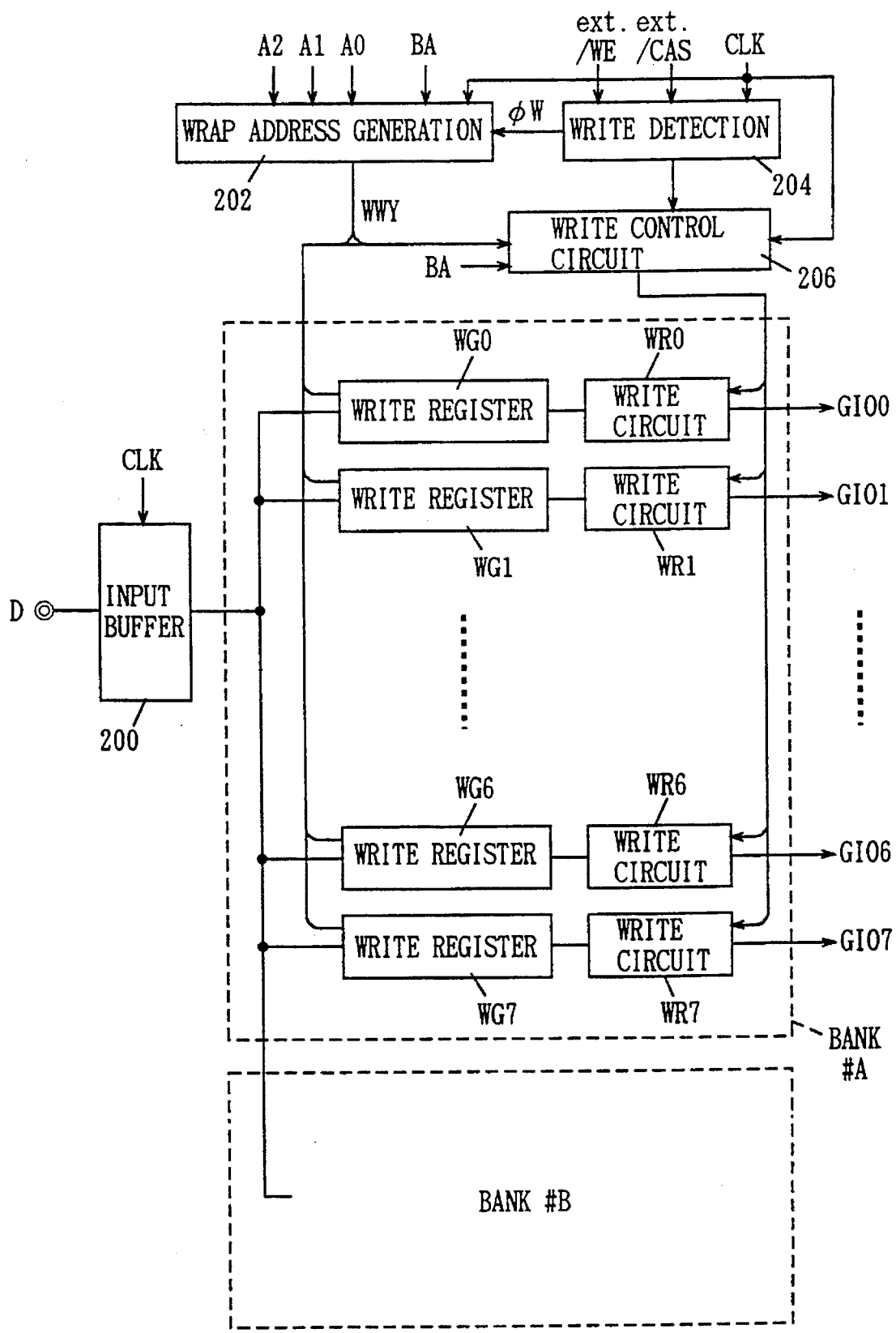
FIG. 13 illustrates a structure of data write circuitry of the SDRAM to which the present invention is applied.

FIG. 13 illustrates a structure of data write circuitry of the SDRAM to which the present invention is applied. Since the banks #A and #B are identical in structure to each other, FIG. 13 shows only a structure for the bank #A. Data write circuitry of the banks #A and #B are coupled to an input buffer 200 in common. The input buffer 200 takes in data supplied to a data input terminal D and generates write data in accordance with the clock signal CLK. FIG. 13 shows the data input terminal D, which may be replaced by the data input/output terminal DQ capable of data output as well. The following description is made with reference to the data input terminal D, in order to emphasize data writing.

The bank #A includes write registers WG0 to WG7 and write circuits WR0 to WR7 which are provided for eight global IO line pairs GIO0 to GIO7, related to the data input terminal D, respectively. In order to control operations of this data write circuitry, provided are a write detection circuit 204 which detects designation of a data write mode, i.e., input of a write command, in response to the signals ext./CAS and ext./WE and the clock signal CLK, a wrap address generation circuit 202 which is activated in response to a write detection signal φW received from the write detection circuit 204 and generates a wrap address WWY in synchronization with the clock signal CLK, and a write control circuit 206 which is activated in response to the write detection signal φW received from the write detection circuit 204 for controlling data writing from the write circuits WR0 to WR7 onto the corresponding global IO line pairs GIO0 to GIO7 in accordance with the clock signal CLK and the wrap address WWY received from the wrap address generation circuit 202.

The wrap address generation circuit 202 and the write control circuit 206 are adapted to generate the wrap address and a write control signal respectively only for a specified bank in accordance with the bank address BA. Alternatively, such wrap address generation circuits 202 and write control circuits 206 may be provided for the banks #A and #B respectively, so that the circuits corresponding to the selected bank are activated in accordance with the bank address signal BA.

Further, the wrap address generation circuit 202 may also serve as a circuit for generating a read wrap address RWY for selecting a read register.

The wrap address generation circuit 202 decodes the bank address signal BA and 3-bit address A0 to A2, to generate the wrap address WWY for successively selecting the write registers WG0 to WG7. This wrap address WWY is successively changed in synchronization with the clock signal CLK, similarly to the case of the read operation. The write registers WG0 to WG7 store write data which are supplied from the input buffer 200 in accordance with the wrap address WWY received from the wrap address generation circuit 202.

The write control circuit 206 activates a prescribed number or all of the write circuits WR0 to WR7 in accordance with the wrap address WWY. Namely, the write control circuit 206 may simultaneously activate the write circuits WR0 to WR7 when data are written in all write registers WG0 to WG7 (when the wrap length is 8). Alternatively, the write control circuit 206 may activate corresponding ones of the write circuits WR0 to WR7 when 2 bit valid data are written, for example, to transmit the write data onto corresponding ones of the global IO line pairs GIO0 to GIO7.

Figure 14:
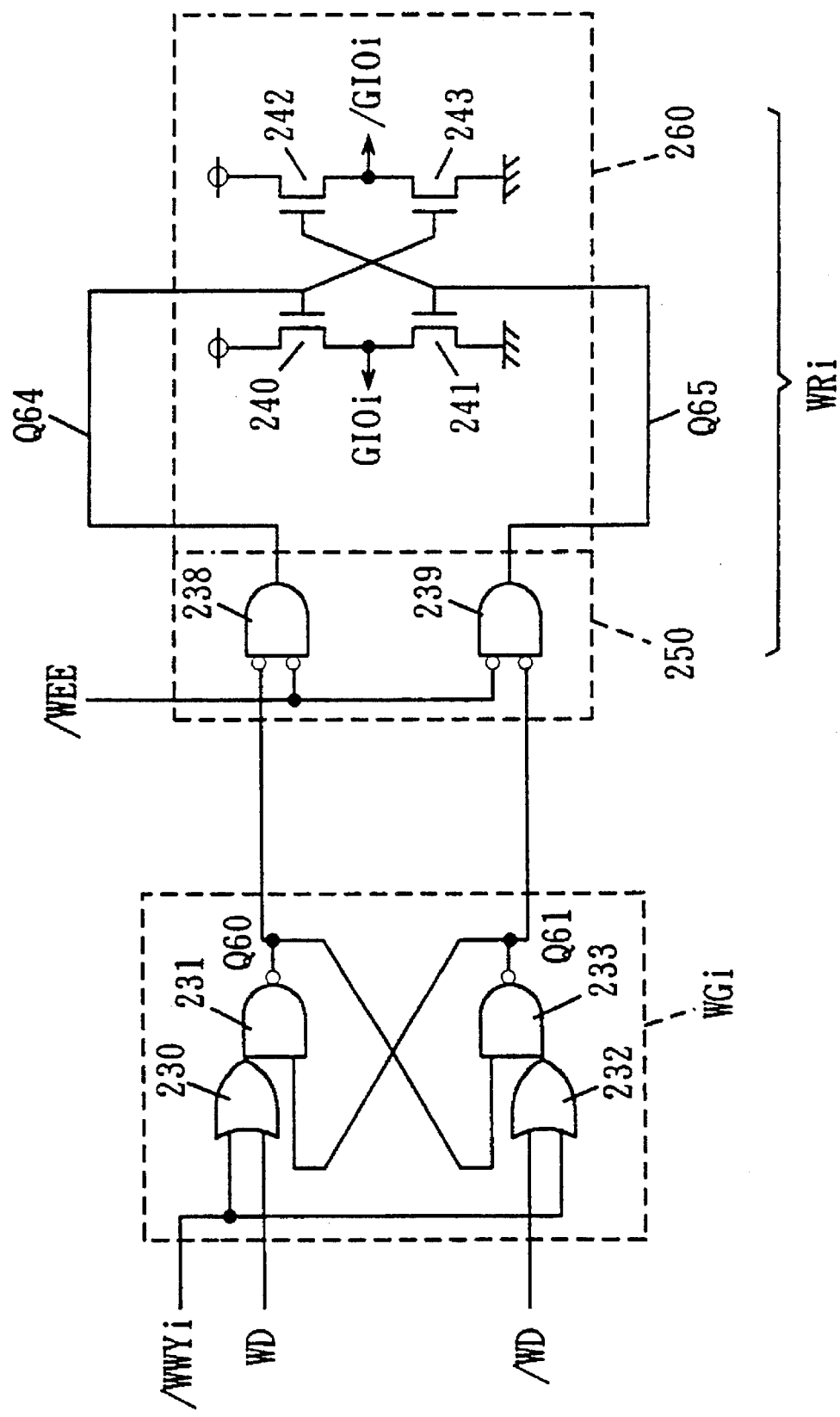
FIG. 14 illustrates exemplary structures of a write register and a write circuit shown in FIG. 13.

FIG. 14 illustrates exemplary structures of each write register and each write circuit shown in FIG. 13. FIG. 14 typically shows a 1-bit write data register WGi and a 1-bit write circuit WRi. The write registers WG0 to WG7 and the write circuits WR0 to WR7 are identical in structure to those shown in FIG. 14.

The write register WGi takes in write data WD and /WD which are supplied from the input buffer 200 (see FIG. 13) in response to a wrap address /WWYi. This write register WGi includes a two-input OR circuit 230 which receives the wrap address /WWYi and the write data WD, another two-input OR circuit 232 which receives the wrap address /WWYi and the write data /WD, and two-input NAND circuits 231 and 233 which receive outputs of the OR circuits 230 and 232 at first inputs thereof respectively. Second inputs and outputs of the NAND circuits 231 and 233 are cross-connected with each other.

This write register WGi takes in the write data WD and /WD when the wrap address /WWYi is at a low level, and latches the taken in signals when the wrap address /WWYi is at a high level, since the outputs of the OR circuits 230 and 232 go high with no regard to the write data WD and /WD.

On the other hand, the write circuit WRi includes a transfer circuit 250 which transmits the data latched by the write register WGi in response to a transfer command signal WEE, and a preamplifier 260 which amplifies an output from the transfer circuit 250 to transmit the same onto global IO lines GIOi and /GIOi.

The transfer circuit 250 includes a two-input NOR circuit 238 which receives the output of the NAND circuit 231 and a transfer command signal /WEE, and another two-input NOR circuit 239 which receives the output of the NAND circuit 233 and the transfer command signal /WEE. When the transfer command signal /WEE goes low, the transfer circuit 250 inverts latch data (on nodes Q60 and Q61) of the write register WGi and transmits the same. When the transfer command signal /WEE is at a high level, outputs of the NOR circuits 238 and 239 go low.

The preamplifier 260 includes n-channel MOS transistors 240 and 241 which are connected in series between a power supply node and a ground potential node, and n-channel MOS transistors 242 and 243 which are connected in series between a power supply node and a ground potential. An output of the NOR circuit 238 provided in the transfer circuit 250 is transmitted to gates of the transistors 240 and 243. An output of the NOR circuit 239 provided in the transfer circuit 250 is supplied to gates of the transistors 241 and 242.

Figure 15:
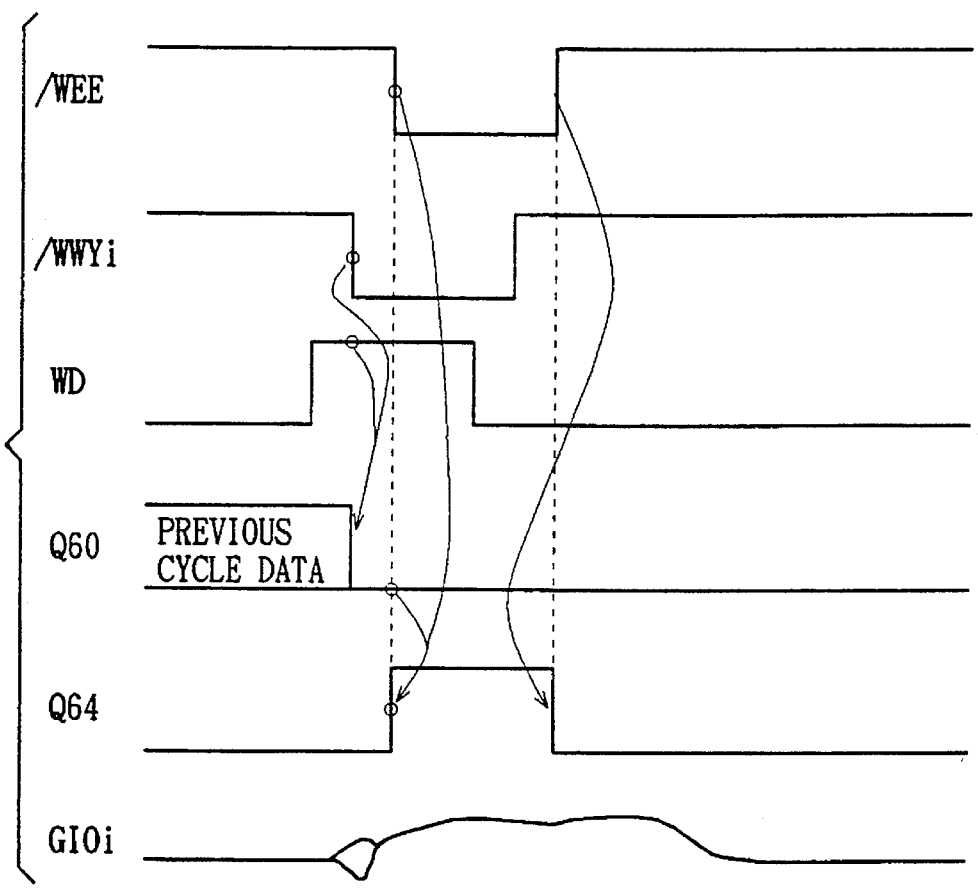
FIG. 15 is a signal waveform diagram showing operations of the circuit shown in FIG. 14.

The preamplifier 260 enters an output high impedance state when both potentials of nodes Q64 and Q65 are at low levels since all transistors 240 to 243 enter OFF states responsively. Namely, no data are transferred when the transfer command signal /WEE is at a high level. The operations of the circuit shown in FIG. 14 are now briefly described with reference to FIG. 15 showing an operation waveform diagram.

First, a write command is supplied so that the SDRAM enters a data write state. A wrap address /WWYi is supplied from the wrap address generation circuit 202. Thus, the write register WGi latches currently supplied write data WD and /WD. Data written in a previous access cycle are latched until the wrap address /WWYi enters a low-level active state.

Following the generation of the wrap address /WWYi, the signal /WEE enters a low-level active state, whereby the NOR circuits 238 and 239 operate as inverter buffers to invert data on the nodes Q60 and Q61 and transmit the same onto the nodes Q64 and Q65. Namely, the potential of the node Q60 goes low when the write data WD is "1" (corresponding to a high-level potential), and then potentials of the nodes Q64 and Q65 go high and low respectively in response to fall of the transfer command signal /WEE.

In response to the high-level signal on the node Q64, the transistors 240 and 243 enter ON states so that the global IO line GIOi is charged by the transistor 240 to reach a high level corresponding to a power supply potential level. On the other hand, the global IO line /GIOi is discharged by the transistor 243, to reach the ground potential level.

Figure 16:
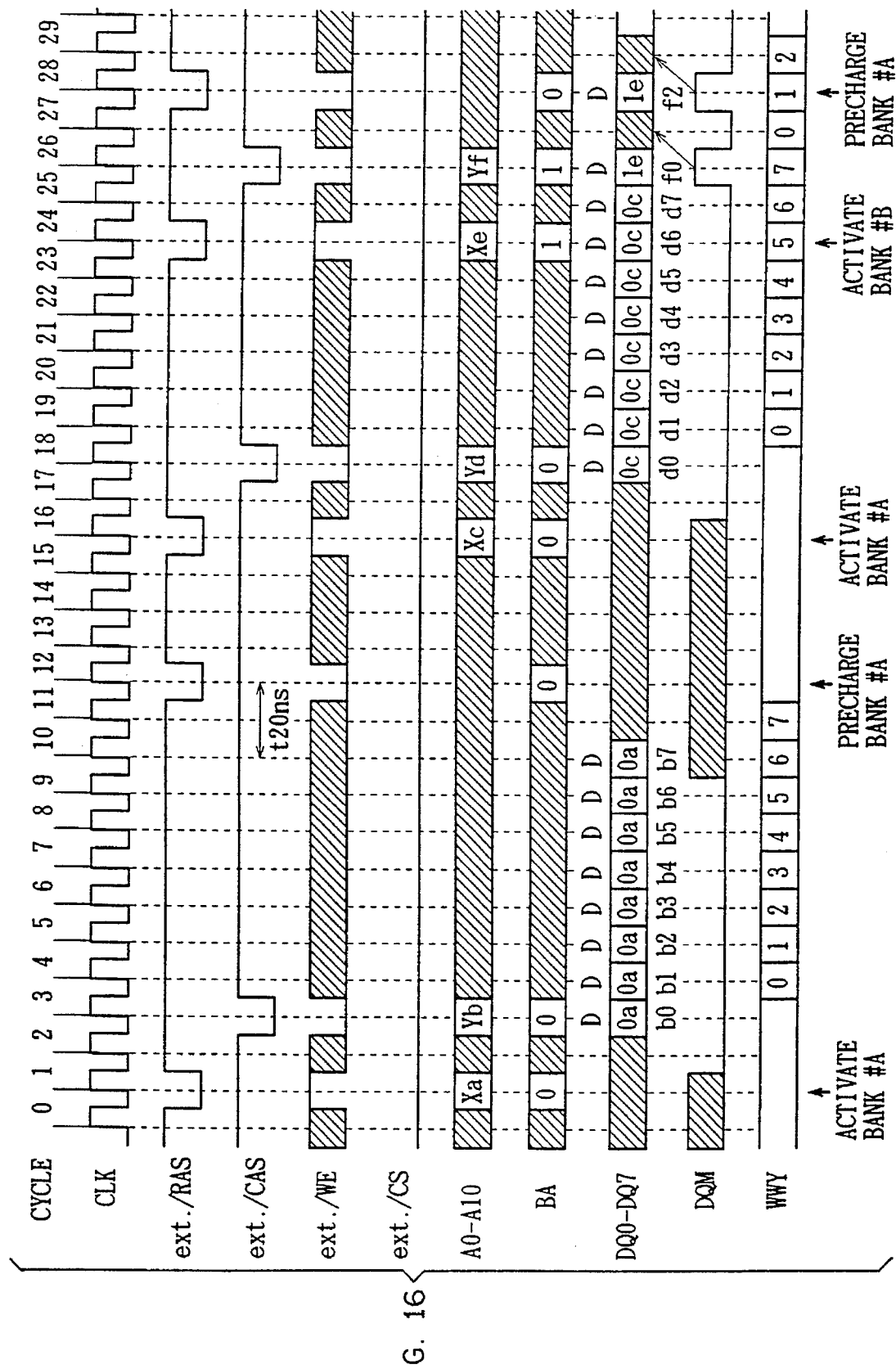
FIG. 16 illustrates states of the external control signals in operation of the write circuit circuitry shown in FIG. 13.

FIG. 16 shows states of the external signals in data writing of the SDRAM. The states of the external signals in the data write operation are now briefly described with reference to FIG. 16.

In the data write operation, data may be simply written in the input buffer 200 simultaneously with input of the write command. Even if the state of the write register WGi is not completely reset, a reset state of the write register WGi may be ascertained before a next clock cycle so that the data supplied with the write command can be written.

Therefore, the signal DQM controls enable/disable of the data writing with a delay of 1 clock from the data writing, dissimilarly to the read operation.

An active command is supplied in a clock cycle 1, so that the bank #A is activated and a row selecting operation is executed. Then, a write command is supplied in a third clock cycle, so that data are written in the bank #A in accordance with a current address Yb and the bank address BAo When the wrap length is 8, 8 byte data are successively inputted from the third clock cycle and written in the write registers WGi. The data written in the write registers WGi are transferred to selected memory cells in the interior in accordance with a data transfer command signal. Since the wrap length is 8, data writing in 64-bit memory cells is completed.

When the signal DQM is set at a high level, write data supplied in a next clock cycle are masked. Referring to FIG. 16, the signal DQM is raised up to a high level in 26-th and 28-th clock cycles, so that write data supplied in 27-th and 29-th clock cycles are not transferred internally.

Also in the data writing, it is possible to alternately activate the banks #A and #B in accordance with the bank address BA. The alternate activation of the banks #A and #B is similar to that in the aforementioned data read operation, and hence the description is omitted.

[Test Circuit]

When data are inputted/outputted in/from a standard DRAM in a plurality of bits, a "multi-bit" test mode of simultaneously reading data from the plurality of bits of memory cells and determining match/mismatch of the simultaneously read data thereby determining pass/fail is employed in order to reduce a test time.

A similar test mode is also applicable to the SDRAM. In this case, it is possible to further reduce the test time by simultaneously activating a plurality of banks, i.e., the banks #A and #B in the test mode and determining match/mismatch of all data read from the plurality of banks (banks #A and #B).

In the SDRAM, it is possible to determine pass/fail at a high speed in the test mode since the data are simultaneously read from a prescribed number of memory cells.

The following description is made with reference to a "burst length" to be distinguished from the wrap length, since constant numbers of read and write registers are provided and fixed with respect to a single data output or input terminal.

A: First Test Circuit

Figure 17:
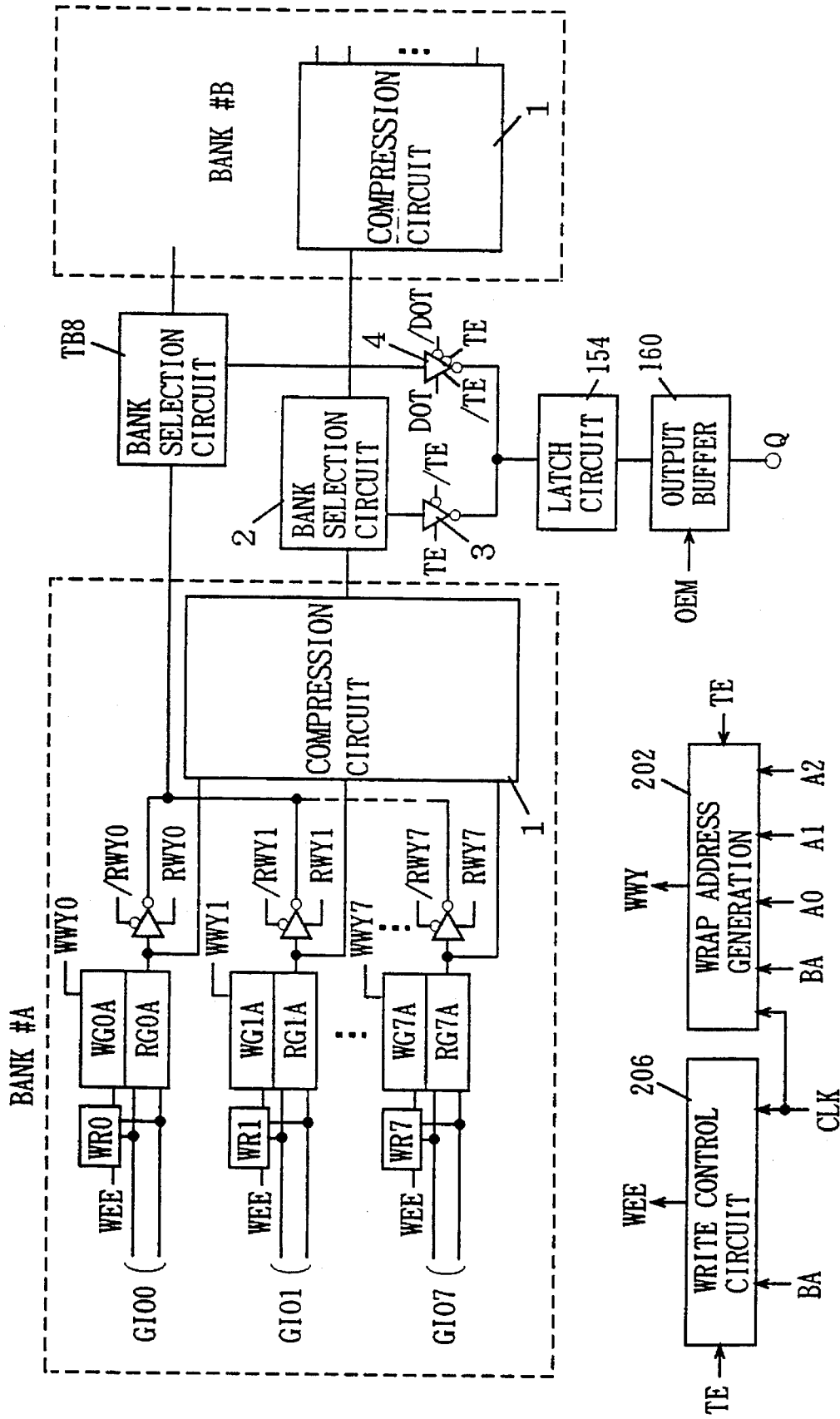
FIG. 17 illustrates a structure of data input/output circuitry in an SDRAM according to an embodiment of the present invention.

FIG. 17 illustrates a structure of data read circuitry of an SDRAM which includes a test circuit according to a first embodiment of the present invention. FIG. 17 shows only a part which is related to 1-bit data, since the SDRAM may have a by 1-bit structure. Referring to FIG. 17, parts corresponding to those shown in FIGS. 8 and 13 are denoted by the same reference numerals, to omit the description thereof.

Referring to FIG. 17, a bank selection circuit TB8 corresponds to the tristate inverter buffers TB8A and TB8B and the latch circuits LA-A and LA-B shown in FIG. 8. A tristate inverter buffer 4 and a latch circuit 154 form the latch circuit 150 shown in FIG. 8. The tristate inverter buffer 4 responds to test mode command signals TE and /TE, in addition to control signals DOT and /DOT. This tristate inverter buffer 4 operates in accordance with the control signals DOT and /DOT when the test mode command signal TE is in a low-level inactive state. It enters an output high impedance state when the test mode command signal TE is in a high-level active state.

The test circuit includes a compression circuit 1 which compresses 8-bit data, i.e., burst length data, outputted from read registers RG0A to RG7A to 1-bit data, a bank selection circuit 2 which selects an output of the compression circuit 1 of either a bank #A or a bank #B, and a tristate inverter buffer 3 which enters an active state in response to the test mode command signal TE to transmit an output of the bank selection circuit 2 to the latch circuit 154. A structure which is identical to the tristate inverter buffers TB8A and TB8B shown in FIG. 8 can be employed for the bank selection circuit 2. Other structures are similar to those shown in FIG. 8, and hence the description of the other structures is omitted.

The compression circuit 1 outputs a high-level signal when all logics of data read from the read registers RG0A to RG7A (in the bank #A) match with each other, while outputting a low-level signal otherwise. An eight-input AND circuit, a match detection circuit or an ExNOR circuit can be employed, for example. The operations are now described.

Figure 18:
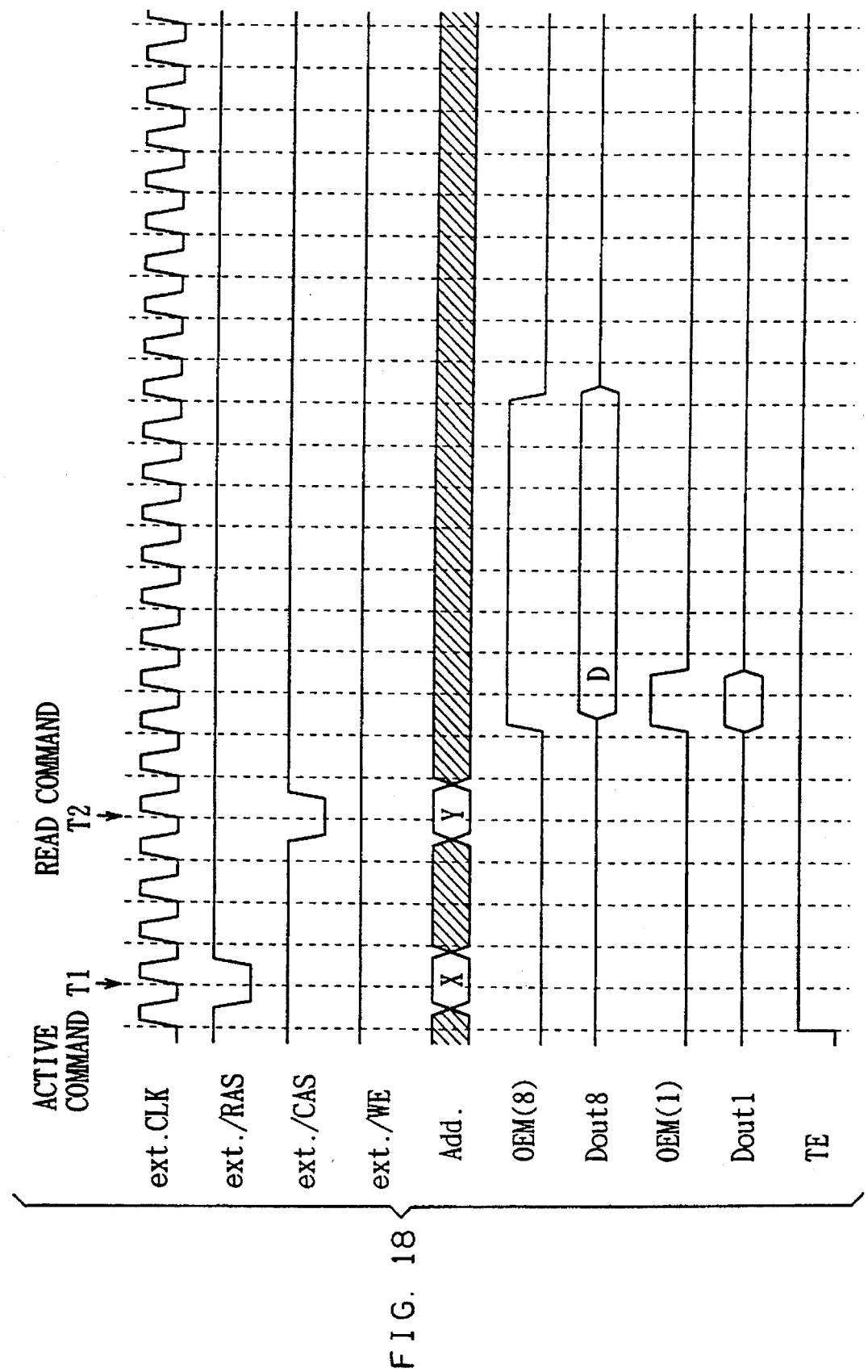
FIG. 18 is a timing chart showing a data read operation of the SDRAM shown in FIG. 17 in a test mode.

FIG. 18 is a timing chart showing a data read operation in a test mode. The operation in the test mode is now described with reference to FIG. 18.

An active command is supplied at time T1, so that a row selecting operation is executed in a selected bank #A or #B. At this time, the test mode command signal TE is already brought into an active state indicating a test mode. This test mode command signal TE may be directly supplied from the exterior to an unused pin. Alternatively, this signal TE may be generated by combination of states of external control signals and a particular address bit. In accordance with the active command, a corresponding word line is selected similarly to an ordinary operation, so that data of a plurality of memory cells which are connected to the selected word line are read on corresponding bit line pairs and amplified by sense amplifiers.

A read command is supplied at time T2, whereby a column address is decided and a column selection line CSL is selected. Thus, eight global IO line pairs GIO0 to GIO7 are connected to the bit line pairs through local IO line pairs with respect to a single data output terminal Q, so that data of the selected memory cells are amplified and latched in the read registers RG0A to RG7A (or RG0B to RG7B).

The compression circuit 1 compresses the data latched in the read registers RG0A to RG7A (or RG0B to RG7B) to 1-bit data. Namely, it outputs a high-level signal when logics of the 8-bit data match with each other, while outputting a low-level signal otherwise.

The bank selection circuit 2 selects the corresponding bank in accordance with a bank address supplied simultaneously with input of the read command. Namely, it selects an output of the compression circuit 1 which is provided in the bank #A or #B. The tristate inverter buffer 3 transmits a data signal received from the bank selection circuit 2 to the latch circuit 154 since the test command signal TE is at a high level. As to the tristate inverter buffer 4, on the other hand, data read in accordance with its wrap address are not transmitted to the latch circuit 154 even if the bank selection circuit TB8 operates, since the test mode command signal TE is at a high level and the tristate buffer 4 is in an output high impedance state.

An output buffer 160 outputs the data latched in the latch circuit 154 through the output terminal Q in accordance with an output enable signal OEM. The output enable signal OEM is activated at timing which is decided by a latency as described above, and reset at timing which is decided by a wrap length. Thus, 8-bit data are compressed to 1-bit data, whereby it is not necessary to continuously read the 8-bit data in a bit by bit basis by setting the wrap length at 8 (OEM(8), Dout(8)) but pass/fail of the memory cells can be determined by simply reading the 1-bit data. In other words, it is possible to determine pass/fail of 8-bit memory cells by the output enable signal OEM(1) having a wrap length of 1, thereby extremely reducing the test time.

Figure 19:
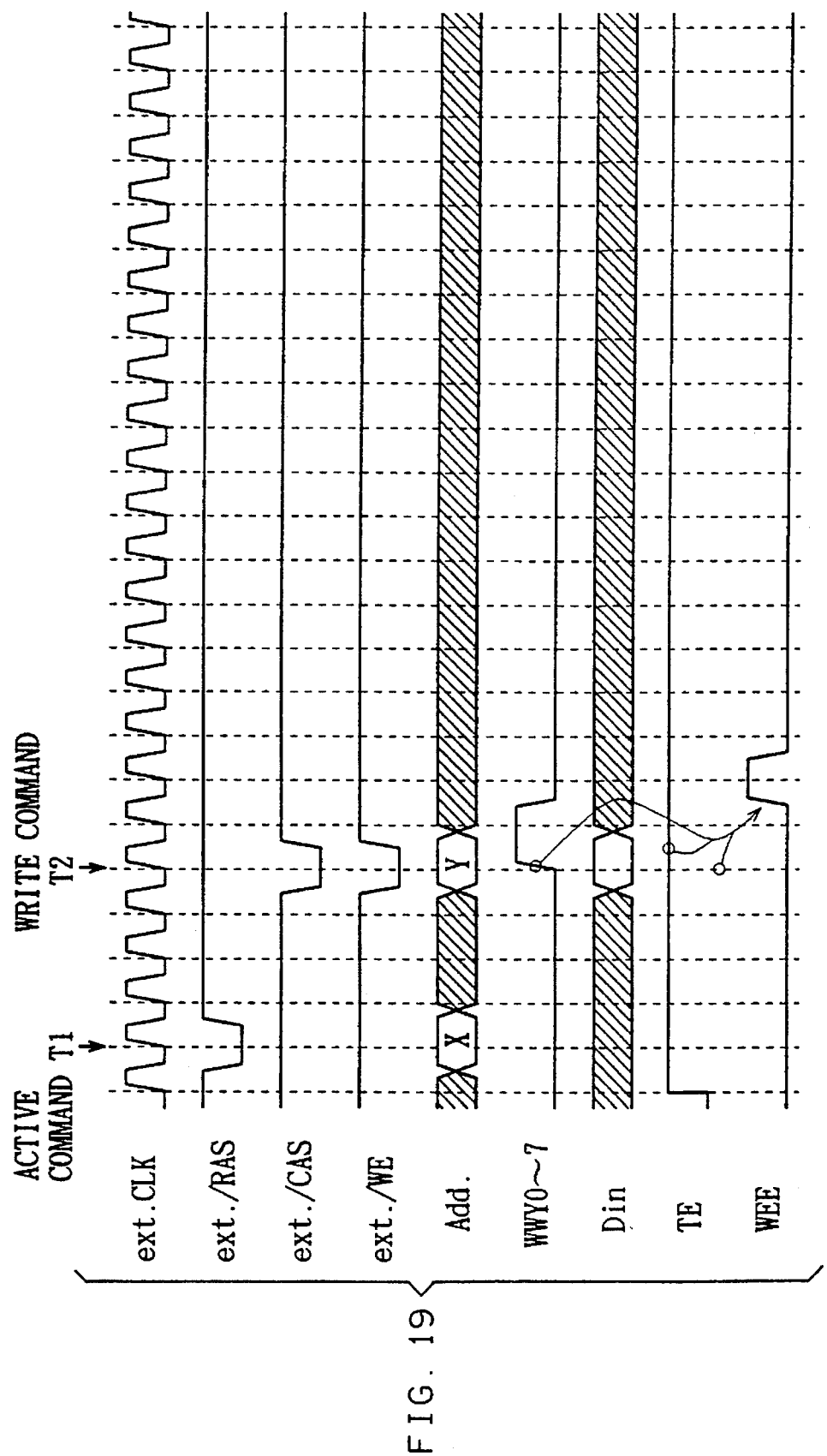
FIG. 19 is a timing chart showing a data write operation of the SDRAM shown in FIG. 17 in a test mode.

FIG. 19 illustrates a data write operation in a test mode.

Referring to FIG. 19, an active command is supplied at time T1, so that a row selecting operation is executed in a selected bank #A or #B, similarly to an ordinary operation mode.

Then, a write command is supplied at a time T2, to determine a column address signal. Since the test mode command signal TE is in a high-level active state, a wrap address generation circuit 202 simultaneously brings all wrap addresses WWY0 to WWY7 into high-level active or selected states. Thus, data supplied to a data input terminal D are simultaneously stored in write registers WG0A to WG7A through an input buffer. Then, simultaneously selected 8-bit memory cells are connected to the global IO line pairs GIO0 to GIO7 in accordance with a transfer command signal WEE. At this time, a write control circuit 206 still receives the test mode command signal TE and operates in a wrap length of not 8 but 1 upon supply of the write command, to transfer the data to the selected memory cells at the timing for storing 1-bit data. Thus, it is possible to extremely reduce a time for writing test data as compared with a case of successively writing the same in the respective write registers WG0A to WG7A in a bit by bit basis.

Figure 20:
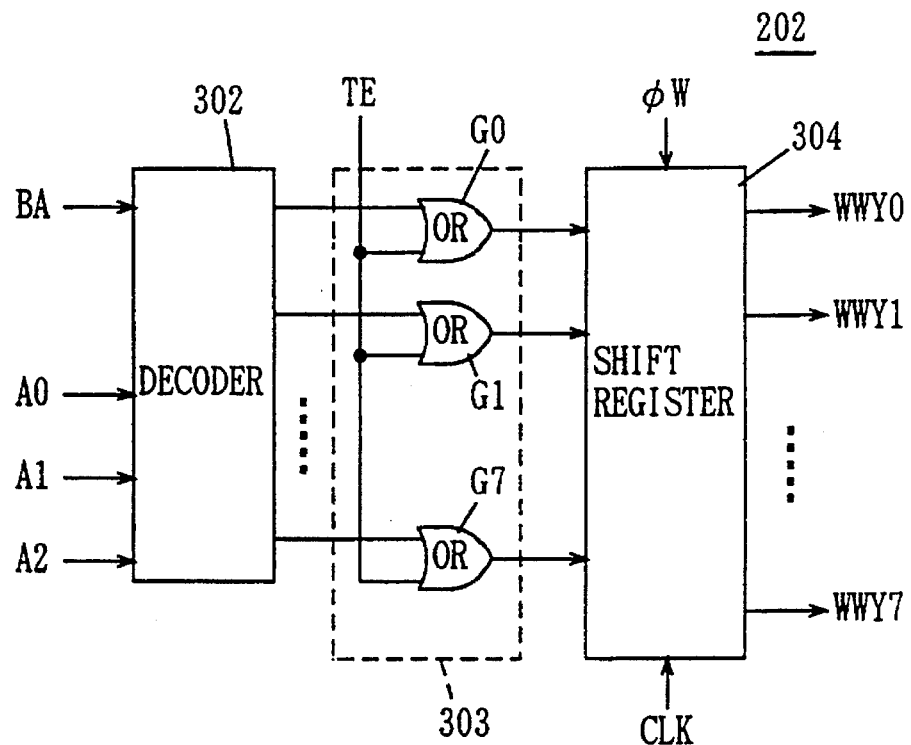
FIG. 20 illustrates an exemplary structure of a wrap address generation circuit shown in FIG. 17.

FIG. 20 illustrates an exemplary structure of the wrap address generation circuit 202 which is provided with respect to one of the banks #A and #B. Referring to FIG. 20, the wrap address generation circuit 202 includes a decoder 302 which receives a bank address signal BA and 3-bit column address signal A0, A1 and A2 for decoding the same, a switching circuit 303 which bringing all outputs of the decoder 302 into a selected state in response to the test command signal TE, and a shift register 304 which latches outputs of the switching circuit 303 for successively shifting the same in response to a clock signal CLK. The switching circuit 303 includes OR gates G0 to G7 which are provided for the respective outputs of the decoder 302. The shift register 304 is activated in response to a write command signal φW which is supplied from the write detection circuit 204 (see FIG. 13), to successively shift the stored data in response to the clock signal CLK. The shift register 304 is connected in the form of a ring, so that an output of a final-stage shift register is connected to an input of a first-stage shift register.

The decoder 302 decodes the supplied signals BA and A0 to A2, to select one of these wrap address signals. The switching circuit 303 passes an output of the decoder 302 when the test command signal TE is in a low-level inactive state. The shift register 304 latches the data supplied from the switching circuit 303. Namely, one of the wrap address signals WWY0 to WWY7 is selected in this state. The shift register 304 carries out a shift operation in response to the clock signal CLK, to successively select the wrap address signals WWY0 to WWY7.

In the test operation, all outputs of the switching circuit 303 enter high-level selected states. In this case, therefore, all wrap address signals WWY0 to WWY7 generated from the shift register 304 are simultaneously selected.

In the structure shown in FIG. 20, the wrap address generation circuit 202 is provided for each of the banks #A and #B. When such a wrap address generation circuit 202 is provided in common for the banks #A and #B, another circuit may be provided for multiplexing the wrap address signals WWY0 to WWY7 outputted from the shift register 304 in accordance with the bank address signal BA.

Figure 21:
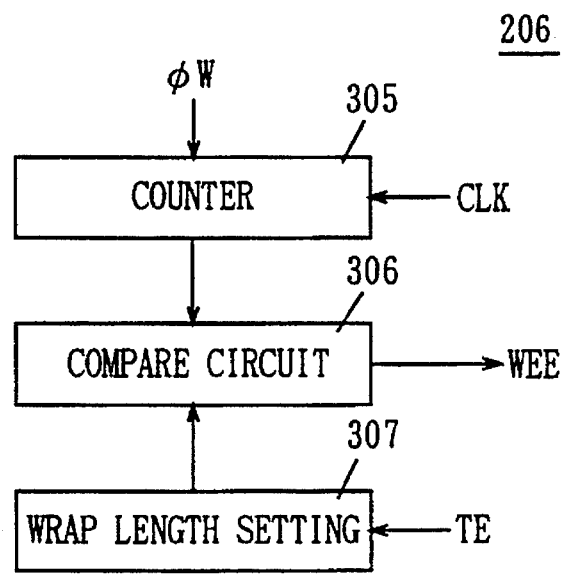
FIG. 21 illustrates an exemplary structure of a write control circuit shown in FIG. 17.

FIG. 21 illustrates an exemplary structure of the write control circuit 206. Referring to FIG. 21, the write control circuit 206 includes a counter 305 which is activated in response to the write command signal φW received from the write detection circuit 204 for counting the clock signal CLK, and a compare circuit 306 which compares a count value set in a wrap length setting circuit 307 with the count value of the counter 305. The wrap length setting circuit 307 is generally set at a burst length, i.e., a wrap length of 8. When the test command signal TE goes high, the wrap length setting circuit 307 is set at a wrap length of 1. The compare circuit 306 generates the transfer command signal WEE for transferring write data.

In an ordinary operation, the compare circuit 306 generates the transfer command signal WEE at the timing of the wrap length of 8 in general. Since the wrap length is set at 1 in a test operation, it generates the data transfer command signal WEE when the count value of the counter 305 reaches 1, triggered by a leading edge of the clock signal CLK, which is subsequent to the cycle receiving a write command. Thus, it is possible to switch data transfer timing between the ordinary and test modes, for writing the test data in the selected memory cells at a high speed.

In the structure shown in FIG. 21, data are transferred from the write registers WG0A to WG7A to the selected memory cells at the same timing. Alternatively, write data may be transferred to the selected memory cells from the write registers WG0A to WG7A storing the same when the data are written in a predetermined number of write registers WG0A to WG7A in an ordinary operation.

[Structure of Compression Circuit]

Figure 22:
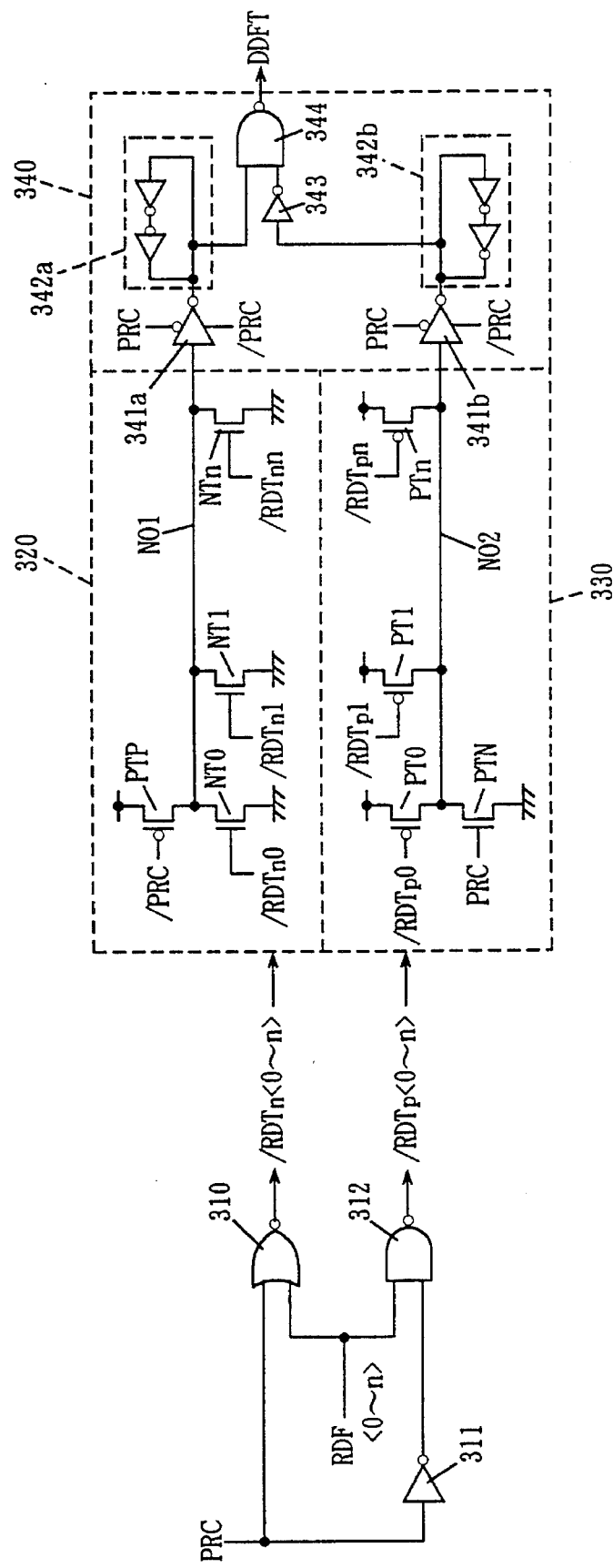
FIG. 22 illustrates a structure of a compression circuit shown in FIG. 17.

FIG. 22 illustrates a structure of the compression circuit 1 shown in FIG. 17. As shown in FIGS. 22A and 22B, this compression circuit 1 includes two circuit parts. In FIG. 22A, the data compression circuit 1 includes a two-input NOR circuit 310 which receives a precharge signal PRC and memory cell data RDF<0 to n> inputted in the read registers, an inverter circuit 311 which inverts the precharge signal PRC, and a two-input NAND circuit 312 which receives the memory cell data RDF<0 to n> and an output of the inverter circuit 311.

The NOR circuit 310 outputs data/RDTn<0 to n>, and the NAND circuit 312 outputs data RDTp<0 to n>. A signal RDF<0 to n> indicates any one bit of memory cell data RDF0 to RDFn. The circuit shown in FIG. 22 is provided for each bit of n-bit memory cell data. Similar indication is also applied to remaining signals RDTp<0 to n> and/RDTn<0 to n>.

Referring to FIG. 22, the compression circuit 1 further includes a first wired NOR circuit 320 including n-channel MOS transistors NT0 to NTn which receive memory cell data /RDTn0 to /RDTnn from the NOR circuit 310 at respective gates, a second wired NOR circuit 330 including p-channel MOS transistors PT0 to PTn which receive data /RDTp0 to RDTpn from the NAND circuit 312 at respective gates, and a logic circuit 340 which performs a prescribed logic operation on outputs of the first and second wired NOR circuits 320 and 330 to output 1-bit compression data DDFT.

In the first wired NOR circuit 320, the transistors NT0 to NTn are connected in parallel with each other between a node NO1 and a ground potential. The first wired NOR circuit 320 further includes a p-channel MOS transistor PTP for precharging the node NO1 at a power supply source potential level in response to a precharge command signal /PRC. The node NO1 is maintained at a high level in a precharged state.

In the second wired NOR circuit 330, the transistors PT1 to PTn are connected in parallel with each other between a node NO2 and a power supply source potential. The second wired NOR circuit 330 further includes an n-channel MOS transistor PTN for precharging the node NO2 at a ground potential in response to the precharge signal PRC. The node NO2 is maintained at a low level in a precharge state.

The logic circuit 340 includes a tristate inverter buffer 341a which receives a potential on the output node NO1 of the first wired NOR circuit 320, a latch circuit 342a which latches an output of the inverter buffer 341a, a tristate inverter buffer 341b which receives a potential of the output node NO2 of the second wired NOR circuit 330, a latch circuit 342b which latches an output of the inverter buffer 341b, an inverter circuit 343 which inverts a latch signal of the latch circuit 342b, and a two-input NAND circuit 344 which receives a latch data signal from the latch circuit 342a and an output signal from the inverter circuit 343. The NAND circuit 344 outputs the 1-bit compression data DDFT.

The tristate inverter buffers 341a and 341b enter output high impedance states when the precharge signal PRC is at a high level to indicate a precharged state. When the precharge signal PRC goes low, the inverter buffers 341a and 341b function as inverters. The operations of the compression circuit 1 shown in FIG. 22 are now described with reference to an operation waveform diagram shown in FIG. 23.

In a stand-by state, the precharge signal PRC is at a high level. At this time, the output /RDTn<0 to n> of the NOR circuit 310 is at a low level. On the other hand, the data signal /RDTp<0 to n> outputted from the NAND circuit 312 is at a high level. In this state, all transistors NT0 to NTn and PT0 to PTn are in OFF states and the precharge transistors PTP and PTN are in ON states in the first and second wired NOR circuits 320 and 330. Therefore, the nodes NO1 and NO2 are precharged at high and low levels respectively.

When a read command is supplied, data are read from the selected memory cells and transmitted to the read registers. When the read data are ascertained, the precharge signal PRC falls to a low level, and the inverted signal /PRC rises to a high level. Thus, the NOR circuit 310 and the NAND circuit 312 operate as inverter circuits, whereby the data signals /RDTn<0 to n> and /RDTp<0 to n> become inverted signals of the data RDF<0 to n> read from the memory cells.

In the wired NOR circuits 320 and 330, the transistors PTP and PTN enter OFF states respectively. Further, the transistors NT0 to NTn and PT0 to PTn enter ON and/or OFF states in response to the read data signals.

In the logic circuit 340, the inverter buffers 341a and 341b are released from output high impedance states to determine signal potentials on the nodes NO1 and NO2 respectively, to set latch data of the latch circuits 342a and 342b at potential levels corresponding to the signal potentials on the nodes NO1 and NO2.

The compression data bit DDFT outputted from the NAND circuit 344 goes high or low in response to the signal potentials latched by the latch circuits 342a and 342b.

When all data RDF<0 to n> read from the memory cells are at high levels, all signals /RDTn<0 to n> and /RDTp<0 to 7> go low. In this case, all transistors NT0 to NTn enter OFF states and all transistors PT0 to PTn enter ON states, whereby the potentials of the nodes NO1 and NO2 go high. Thus, the signal potentials latched by the latch circuits 342a and 342b go low, and the compression data bit DDFT outputted from the NAND circuit 344 goes high.

When all data RDF<0 to n> read from the memory cells are at low levels, on the other hand, all data signals /RDTn<0 to n> and /RDTp<0 to n> go high. In this case, all transistors NT0 to NTn enter ON states and all transistors PT0 to PTn enter OFF states, whereby both potentials of the nodes NO1 and NO2 go low. Both latch signal potentials of the latch circuits 342a and 342b go high, and the compression data bit DDFT outputted from the NAND circuit 334 goes high.

Figures 23, 24:
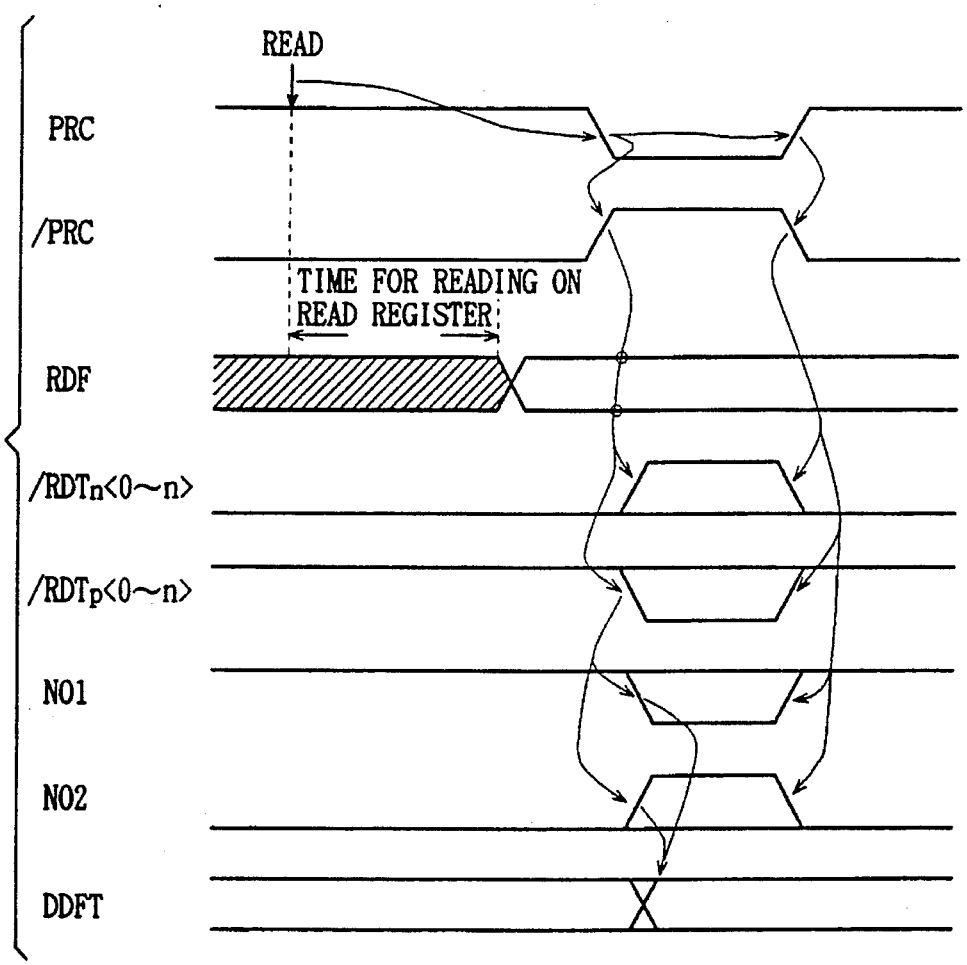
FIG. 23 is a signal waveform diagram showing operations of the compression circuit shown in FIG. 22.
FIG. 24 illustrates states of internal signals and current states of degeneration data bits in operation of the compression circuit shown in FIG. 22.

When the data RDF<0 to n> read from the memory cells include high-level and low-level data, at least one of the transistors NT0 to NTn and one of PT0 to PTn enter ON state. In this case, the potential of the node NO1 is discharged through the ON-state transistor to go low, while that of the node NO2 is charged through the ON-state transistor to go high. The latch circuit 324a latches the high-level signal, while the latch circuit 342b latches the low-level signal. In this case, the NAND circuit 344 receives high-level signals at both inputs, whereby the signal DDFT outputted from the NAND circuit 344 is changed to a low level. When the signal DDFT is at a low level, this indicates presence of a defective memory cell since the outputted signal has a different logic in spite of the same data as written. In other words, it is possible to express match and mismatch of logics of data of a plurality of memory cells in high and low levels respectively by the signal potentials latched by the latch circuits 342a and 342b. Thus, it is possible to simultaneously determine match/mismatch of a plurality of memory cell data thereby determining defectiveness/nondefectiveness of selected memory cells at a high speed, as shown in FIG. 24.

This compression circuit 1 is provided at output side of the read registers in the aforementioned structure, to receive data latched in the read registers. Alternatively, the compression circuit 1 may receive data amplified by preamplifiers which are included in the read registers, or data appearing on the global IO line pairs GIO.

Due to employment of the compression circuit 1 having the aforementioned structure, it is possible to extremely reduce the number of elements as compared with a test circuit structure of an EXOR circuit which is employed in a standard DRAM for implementing a multi-bit test mode, thereby reducing the circuit scale and implementing a compression circuit having a small occupied area.

In the test mode, the precharge signal PRC is delayed by a prescribed time (when the data stored in the read registers or the read data on the global IO line pairs are ascertained) when a read command is supplied and thereafter generated in the form of one-shot pulse through triggering by such a delay signal. A circuit structure for generating such a precharge signal PRC can be easily implemented.

Figure 25:
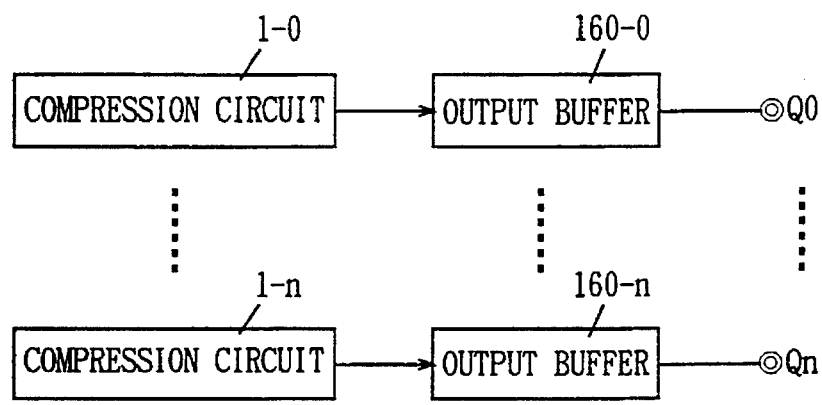
FIG. 25 illustrates an arrangement for outputting test data in the SDRAM according to the present invention.

The aforementioned structure is also applicable to n output terminals. In general, an SDRAM has a multi-bit input/output structure such as a by 8-bit or by 16-bit structure. In this case, the compression circuit is provided every data output terminal. FIG. 25 shows arrangement of compression circuits 1-0 to 1-n for n data output terminals Q0 to Qn. As shown in FIG. 25, the compression circuits 1-0 to 1-n transmit 1-bit compression data to the corresponding data output terminals Q0 to Qn through corresponding output buffers 160-0 to 160-n respectively.

B: Second Arrangement of Compression Circuit

Figure 26:
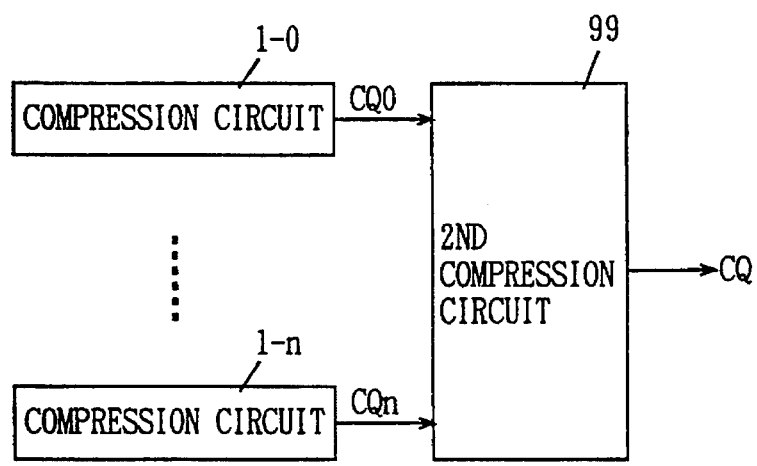
FIG. 26 illustrates another structure of a data compression mode of the SDRAM according to the present invention.

FIG. 26 illustrates another structure of the test circuit. As shown in FIG. 26, compression bit data CQ0 to CQn which are outputted from compression circuit 1-0 to 1-n provided in correspondence to respective data output terminals Q0 to Qn are further compressed to 1-bit data by a second compression circuit 99. In the case of this structure, 64-bit memory cell data are compressed to 1-bit data in an 8-bit structure, whereby it is not necessary to determine pass/fail by recognizing data at each data output terminal, and the structure of an external test circuit is simplified.

Figure 27:
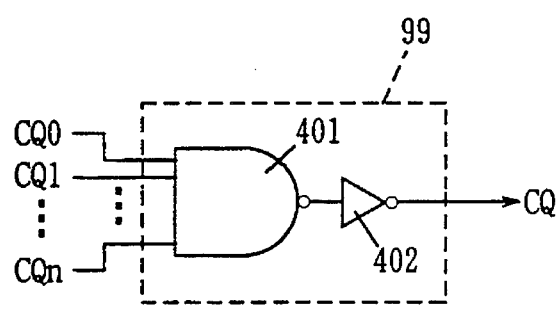
FIG. 27 illustrates a structure of a second compression circuit shown in FIG. 26.

FIG. 27 illustrates an exemplary structure of the second compression circuit 99 shown in FIG. 26. Referring to FIG. 27, the second compression circuit 99 receives 1-bit compression data CQ0 to CQn from compression circuits 1-0 to 1-n which are provided for respective ones of data output terminals, to output 1-bit compression data CQ. This second compression circuit 99 includes an n-input NAND circuit 401 which receives the compression data bits CQ0 to CQn, and an inverter circuit 402 which receives an output of the NAND circuit 401. The NAND circuit 401 and the inverter circuit 402 execute .AND operation on the compression data bits CQ0 to CQn. If the compression data bits CQ0 to CQn at least include 1-bit low-level data, i.e., a signal indicating fail, the compression data bit CQ goes low. The final compression data bit CQ goes high only when all compression data bits CQ0 to CQn are at high levels for indicating pass states. Thus, it is possible to simultaneously determine pass/fail of a simultaneously selected plurality of memory cells (burst length x n memory cells) by determining whether the final compression data bit CQ is at a high level or a low level.

Figure 28:
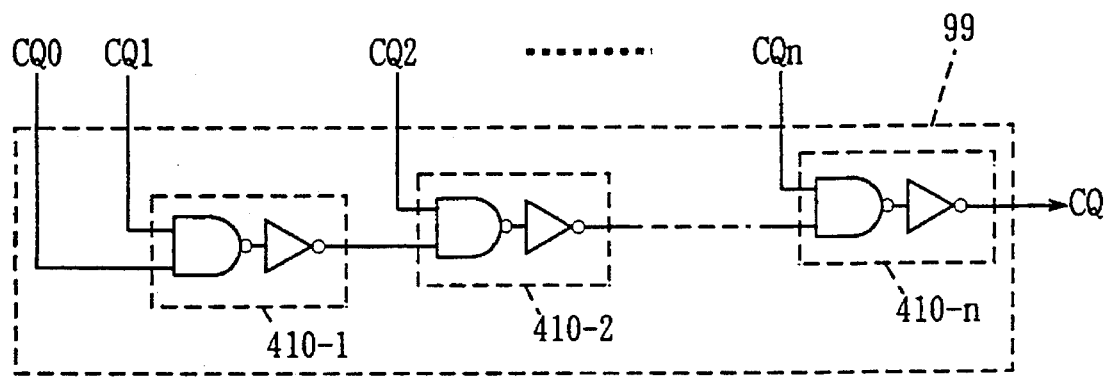
FIG. 28 illustrates another structure of the second compression circuit shown in FIG. 26.

FIG. 28 illustrates another exemplary structure of the second compression circuit 99. Referring to FIG. 28, the second compression circuit 99 includes unit compression gates 410-1 to 410-n which are provided for respective compression circuits 1-1 to 1-n. Each of the unit compression gates 410-1 to 410-n includes a two-input NAND gate and an inverter circuit which receives an output of the NAND gate. A unit compression gate 410-i receives an output of a compression data bit CQi from a corresponding compression circuit and an output from a preceding stage unit compression gate 410-(i-1). The unit compression gate 410-i carries out an AND operation. The first-stage unit compression gate 410-1 receives compression data bits CQ0 and CQ1.

Also in this structure, the final compression data bit CQ goes low when any compression data bit is at a low level.

The structure shown in FIG. 27 has advantages of a small number of gates and a short delay time. In the structure shown in FIG. 28, on the other hand, an occupied area can be reduced since this structure is formed by two-input gates.

Figure 29:
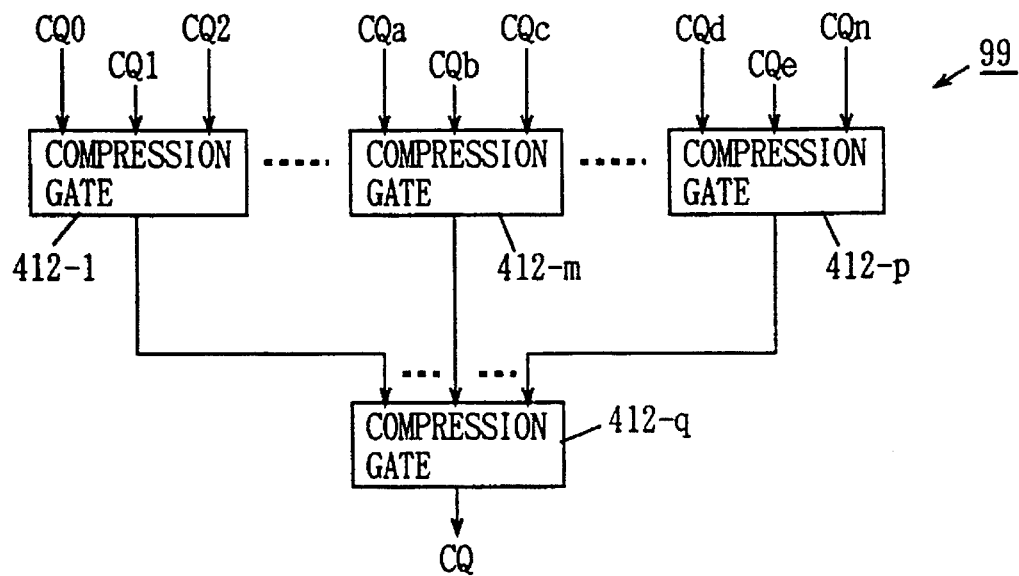
FIG. 29 illustrates still another structure of the second compression circuit shown in FIG. 26.

FIG. 29 illustrates still another structure of the second compression circuit 99. The second compression circuit 99 shown in FIG. 29 includes compression gates 12-1, . . . , 412-m, . . . 412-p which are provided for respective outputs of a prescribed number of compression circuits, and a compression gate 412-q which receives outputs of the compression gates 412-1 to 412-p. Referring to FIG. 29, each of the compression gates 412-1 to 412-p is provided for three compression data bits (i.e., outputs of three compression circuits). Each of the compression gates 412-1 to 412-q executes an AND operation on the received inputs. In this structure, it is possible to optimize an interconnection area and a gate occupied area and minimize the number of gates thereby reducing the delay time even if a plurality of data output terminals are provided.

In the structure show in FIG. 29, outputs of a prescribed number of compression circuits are temporarily compressed and these compressed data are further compressed to generate a final compression data bit. In this case, the output of the compression gate 412-1 may be transmitted to an adjacent compression gate, as shown in FIG. 28. In other words, the output of each compression gate may be transmitted to the adjacent one, similarly to the structure shown in FIG. 28.

Figure 30:
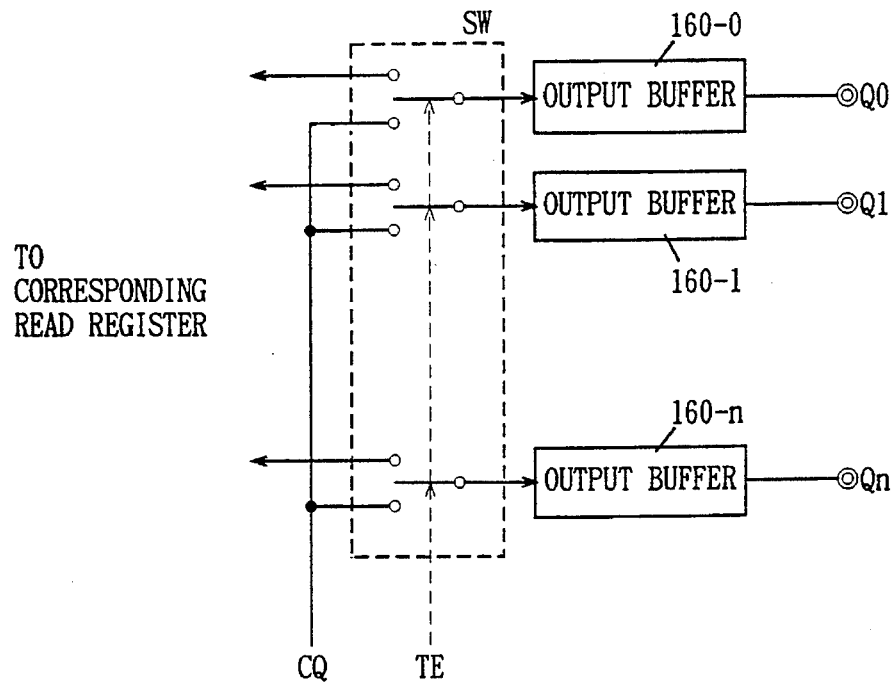
FIG. 30 illustrates an exemplary output scheme of compressed data bits outputted from the second compression circuit.

FIG. 30 illustrates an exemplary structure of an output portion for a final compression data bit. Referring to FIG. 30, a switching circuit SW whose input terminals are switched in accordance with the test command signal TE is provided between buffers 160-0 to 160-n and a portion (bank selection circuit TB8 shown in FIG. 17) to which read data are transmitted in an ordinary operation. In a test mode, the switching circuit SW transmits a final data bit CQ to all output buffers 160-0 to 160-n. In this case, data of the same logic are outputted from data output terminals Q0 to Qn, whereby it is possible to identify a malfunction of a data output circuit including the output buffers 160-0 to 160-n.

Figure 31:
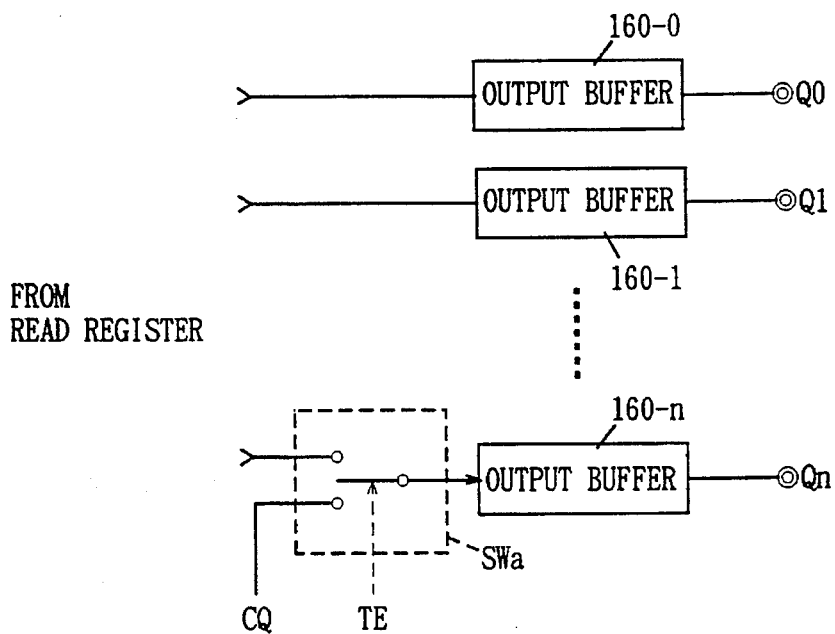
FIG. 31 illustrates another exemplary output scheme of the compressed data bits outputted from the second compression circuit.

FIG. 31 illustrates another structure of an output portion for a final compression data bit CQ. Referring to FIG. 31, a switching circuit SWa is provided only for a particular output buffer (output buffer 160-n in FIG. 31). The switching circuit SWa sets its input terminal to a read register side or the final compression data bit CQ in accordance with the test command signal TE. In a test mode, the final compression data bit CQ is transmitted to only the particular output buffer (160-n). In other words, the final compression data bit CQ is outputted through only a particular data output terminal (Qn in FIG. 31). In this case, it is possible to determine defectiveness/nondefectiveness through only data appearing at the particular pin terminal.

Figure 32:
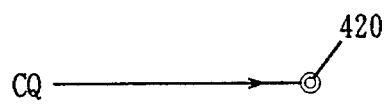
FIG. 32 illustrates still another exemplary output scheme of the compressed data bits outputted from the second compression circuit.

FIG. 32 illustrates still another output arrangement for a final compression data bit CQ. In the structure shown in FIG. 32, the final compression data bit CQ is outputted through an unused pin terminal 420. In this case, it is not necessary to drive output buffers, thereby reducing a consumed current.

While only the final compression data bit CQ is outputted in the aforementioned description, the structure may be capable of outputting both of compression data bits for the respective data output terminals and the final compression data bit.

C: Modification of Test Circuit

Figure 33:
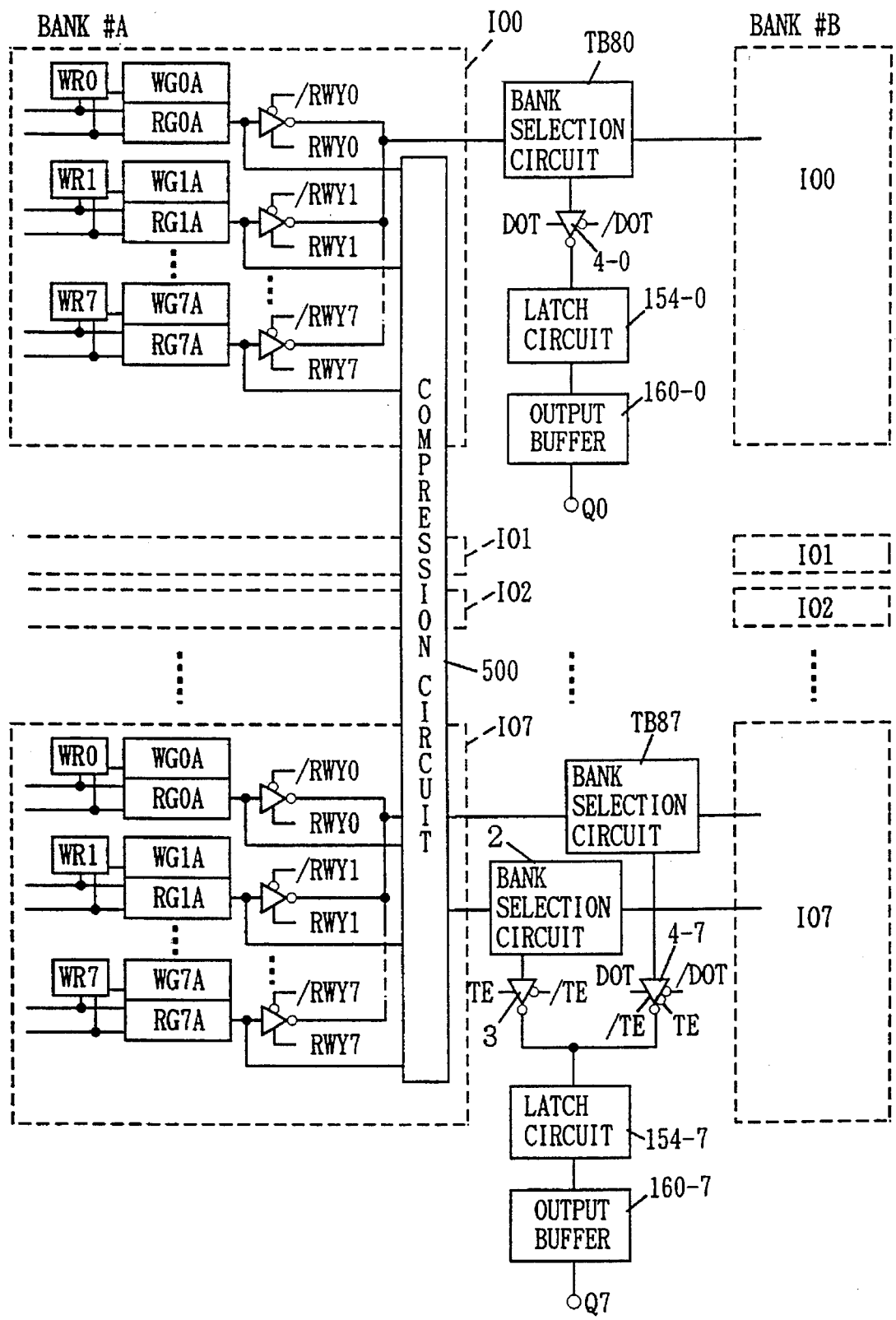
FIG. 33 illustrates another structure of the SDRAM according to the present invention.

FIG. 33 illustrates still another structure of the test circuit according to the present invention. Referring to FIG. 33, an SDRAM has 8-bit data output terminals Q0 to Q7, and data read circuits IO0 to IO7 are provided for the data output terminals Q0 to Q7 respectively. The data read circuits IO0 to IO7 are provided in each of banks #A and #B. A compression circuit 500 is provided in common for the data read circuits IO0 to IO7 in each of the banks #A and #B. Namely, the compression circuit 500 simultaneously compresses data (64-bit data, for example) of simultaneously selected memory cells to 1-bit compression data.

The bank #B is also provided with a similar compression circuit 500. A compression data bit outputted from each compression circuit 500 is transmitted to a particular data output terminal (Q7 in FIG. 33). In order to enable such transmission, provided are a bank selection circuit 2 for selecting the output of the compression circuit 500, and a tristate inverter buffer 3 which passes an output of the bank selection circuit 2 in response to a test mode command signal TE. An output of the tristate inverter buffer 3 is transmitted to the data output terminal Q7 through a latch circuit 154-7 and an output buffer 160-7. The compression data bit from the compression circuit 500 is not outputted to remaining data output terminals Q0 to Q6. This structure of the compression circuit 500 is implemented through the aforementioned circuit shown in FIG. 22.

The operations are identical to those described above with reference to FIG. 17. Burst length×8-bit memory cell data are simultaneously compressed to 1-bit compression data, and outputted to the data output terminal Q7 through the bank selection circuit 2, the inverter buffer 3, the latch circuit 154-7 and the output buffer 160-7. Alternatively, the compression data bit outputted from the compression circuit 500 may be outputted to all data output terminals Q0 to Q7 (see FIG. 30).

[Write Circuitry for Test Data]

In the test data write operation described above with reference to FIG. 19, the wrap address signals WWY0 to WWY7 are simultaneously selected. Thus, it is possible to write the same data in write registers which are related to a single data input terminal in a single clock cycle. In this case, the data can be written according to either of two methods.

Figure 34:
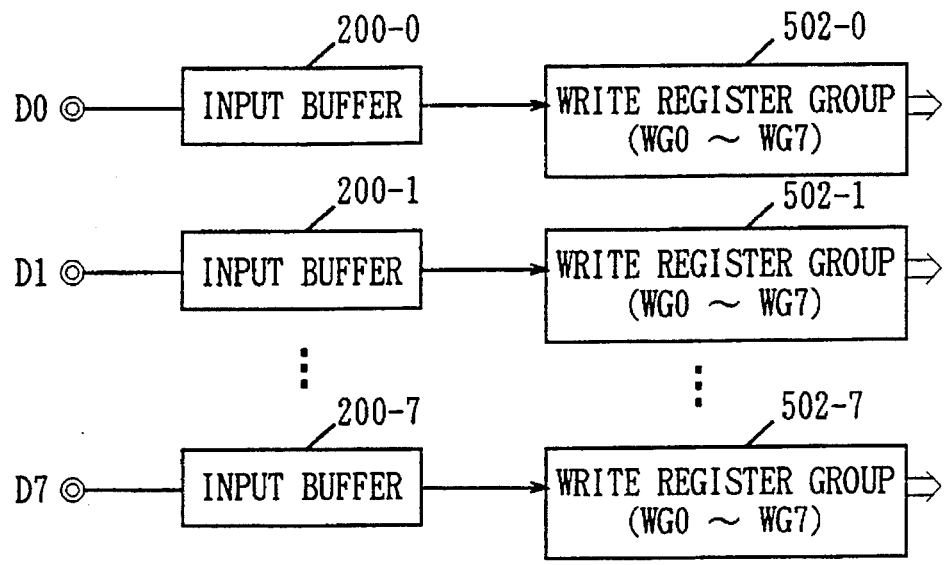
FIG. 34 illustrates an arrangement for writing test data in the SDRAM according to the present invention.

FIG. 34 is a diagram for illustrating a test data write mode. In the structure shown in FIG. 34, test data received from input buffers 200-0 to 200-7 which are provided in correspondence to data input terminals D0 to D7 are supplied to corresponding write register groups 502-0 to 502-7 respectively. Each write register group 502 includes the aforementioned write registers WG0 to WG7. Thus, the test data supplied to corresponding data input/output terminals are written in the write registers WG0 to WG7.

Figure 35:
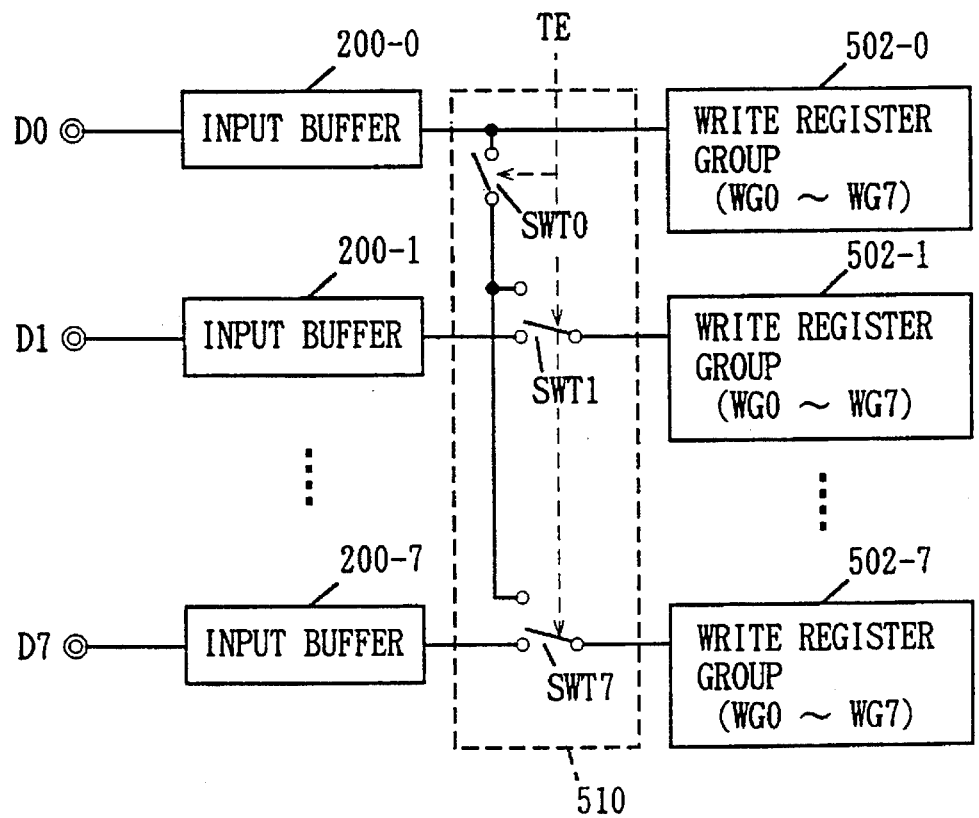
FIG. 35 illustrates another writing arrangement for test data in the SDRAM according to the present invention.

FIG. 35 illustrates another test data write arrangement. In the structure show in FIG. 35, a switching circuit 510 is provided between input buffers 200-0 to 200-7 and write register groups 502-0 to 502-7. The switching circuit 510 includes a switch SWT0 which conducts in response to a test mode command signal TE, and switching circuits SWT1 to SWT7 which select a signal transmitted from the switch SWT0 in response to the test mode command signal TE. The switching circuits SWT1 to SWT7 are provided in correspondence to the input buffers 200-1 to 200-7 respectively. In an ordinary operation, the switching circuits SWT1 to SWT7 select outputs of the corresponding input buffers 200-1 to 200-7.

When the test mode command signal TE enters an active state, the switch SWT0 enters a conducting state so that write data supplied from the input buffer 200-0 are selected by the switching circuits SWT1 to SWT7 and transmitted to the corresponding write register groups 502-1 to 502-7. In this case, therefore, test data supplied to the data input terminal D0 are transmitted to all the write register groups 502-0 to 502-7. In other words, data supplied to a particular data input terminal (D0 in FIG. 35) is written in all write registers in a single clock cycle. In this case, it is possible to write test data by simply supplying 1-bit test data for effectively writing the same also in an SDRAM having a by 8-bit structure.

C: Further Structure of Test Circuit

Figure 36:
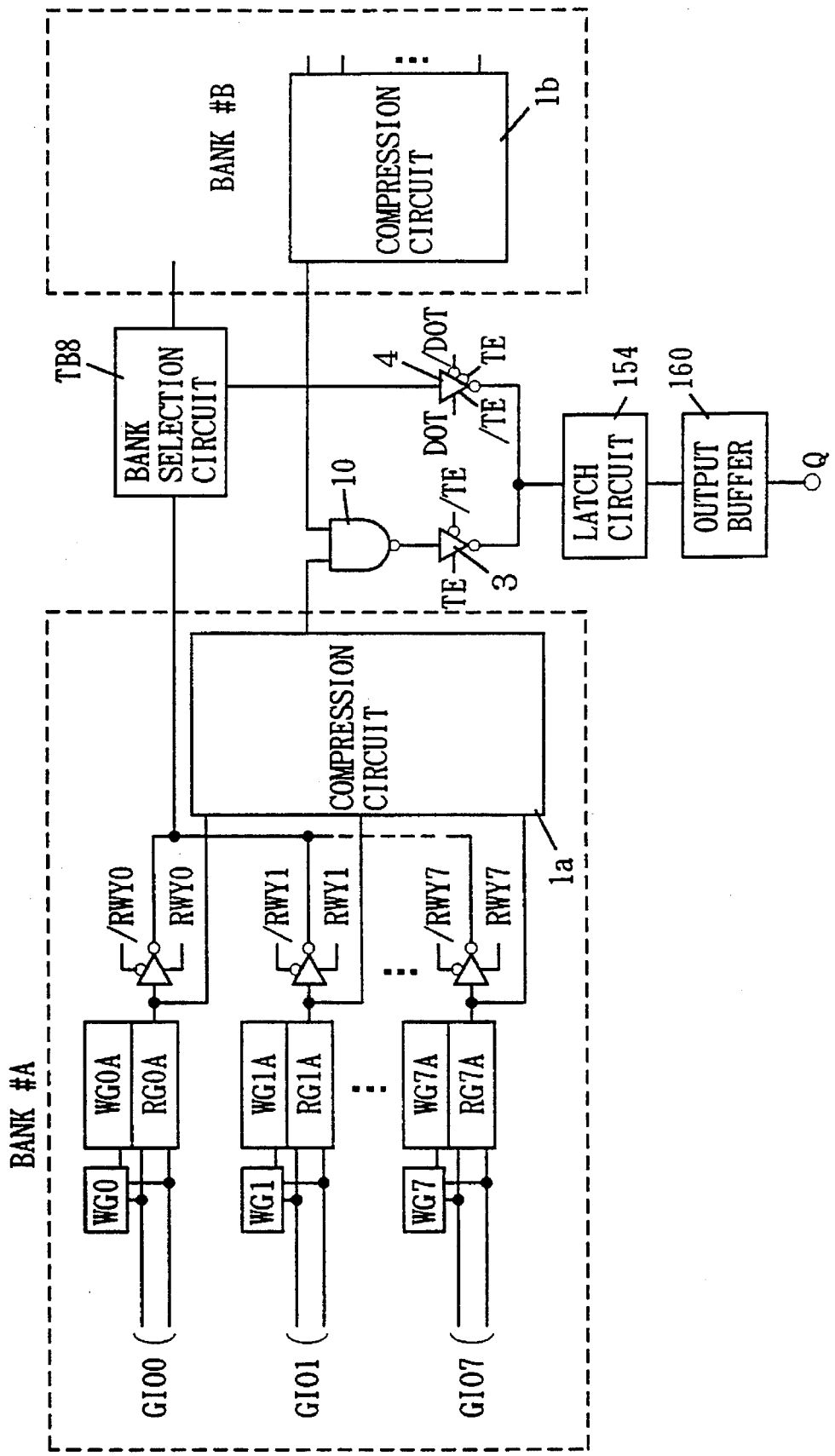
FIG. 36 illustrates a structure of test circuitry of an SDRAM according to still another embodiment of the present invention.

FIG. 36 illustrates still another structure of data read circuitry of the SDRAM according to the present invention. The structure shown in FIG. 36 includes a gate circuit 10 which receives compression data bits from compression circuits 1a and 1b provided in banks #A and #B, and a tristate inverter buffer 3 which passes an output of the gate circuit 10 in accordance with a test mode command signal TE. Namely, data of memory cells selected in the banks #A and #B are further compressed by the gate circuit 10. In this case, it is possible to simultaneously test the two banks #A and #B, thereby making the test at a higher speed.

The compression circuits 1a and 1b may be provided in correspondence to each data output terminal Q, or in common for all data output terminals, as shown in FIG. 33. The gate circuit 10 outputs a low-level signal when both inputs thereof are at high levels. The output of the gate circuit 10 is inverted by the tristate inverter buffer 3. When all logics of data of memory cells selected in the banks #A and #B in a test mode match with each other, therefore, a high-level signal is outputted indicating a pass state. In an ordinary operation, memory cell data which is selected by a bank selection circuit TB8 and an inverter buffer 4 is selected and read in accordance with a specified bank address (the tristate inverter buffer 3 is in an output high impedance state in an ordinary operation mode).

The banks #A and #B are activated and precharged independently of each other. In the structure shown in FIG. 36, therefore, an active command is supplied to activate the bank #A, and then an active command for the bank #B is supplied to activate the same in a test operation. Then, read commands are supplied for the banks #A and #B respectively. Therefore, it is necessary to input active and read commands for the banks #A and #B respectively. In a test operation mode, however, it is convenient to supply operation instruction to both banks #A and #B with a single command. FIG. 37 shows a structure for implementing such an operation mode.

FIG. 37 shows a structure of a bank selective activation circuit, which is included in the second control signal generation circuit 118 shown in FIG. 5.

Referring to FIG. 37, the bank selective activation circuit includes an inverter circuit 61 which inverts a bank address signal BA, a two-input NAND circuit 62 which receives the bank address signal BA and an inverted signal /TE of a test mode command signal TE, a two-input NAND circuit 63 which receives an output of the inverter circuit 61 and the inverted test mode command signal /TE, a two-input NAND circuit 64 which receives an activation control signal ACT and an output of the NAND circuit 62, a two-input NAND circuit 65 which receives the activation control signal ACT and an output of the NAND circuit 63, and inverter circuits 66 and 67 which invert outputs of the NAND circuits 64 and 65 respectively.

The activation control signal ACT corresponds to the signals φR, RADE and CADE generated from the first control signal generation circuit 116 shown in FIG. 5. Namely, the activation control signal ACT enters an active state when an active command is supplied, to start strobing of an address signal and a row selecting operation. This signal ACT enters an inactive state when a precharge command is supplied.

An internal activation signal ACT-A is adapted to activate the bank #A, while an internal activation signal ACT-B is adapted to activate the bank #B. When the internal activation signals ACT-A and ACT-B enter high-level active states, activation (row selecting operation) of the corresponding banks #A and #B is started. Namely, the internal activation signals ACT-A and ACT-B can be considered to correspond to internal RAS signals in a standard DRAM. The operations are now described with reference to FIGS. 38 and 39.

First, operations in a test operation mode are described with reference to FIG. 38. In the test operation mode, the inverted test mode command signal /TE is at a low level. In this state, both outputs of the NAND circuits 62 and 63 go high. Namely, the bank address signal BA is ignored, so that both banks #A and #B are specified no matter whether the bank address signal BA is "0" or "1".

After a lapse of a certain time from supply of an active command, the activation control signal ACT rises to a high level. In response to this, the NAND circuits 64 and 65 output low-level signals, and then the inverter circuits 66 and 67 output high-level signals. Thus, both internal activation signals ACT-A and ACT-B enter high-level states, to activate both banks #A and #B. In the structure shown in FIG. 36, therefore, the compression circuits 1a and 1b can output compression data bits substantially at the same timing in the banks #A and #B, so that the memory cells can be tested at a high speed.

Operations in a normal mode are described with reference to FIG. 39. In the normal mode, the inverted test command signal /TE is set at a high level. In this state, the NAND circuits 62 and 63 operate as inverter buffers.

It is assumed that the bank address BA is set at "0" (corresponding to a low-level potential). After a lapse of a certain time after supply of an active command, the activation control signal ACT rises to a high level. Since the bank address signal BA is at a low-level potential, the outputs of the NAND circuits 62 and 63 are ascertained at high and low levels respectively. When the activation control signal ACT rises from a low level to a high level, the outputs of the NAND circuits 64 and 65 which have been at high levels go low and high respectively. The internal activation signal ACT-A rises to a high level responsively, to activate the bank #A.

In data reading, the bank selection circuit TB8 selects data read from the bank #A in accordance with the bank address signal BA, to transmit the same to the inverter buffer 4.

In the aforementioned operations, both banks #A and #B are simultaneously activated to read the data. Also in test data writing, write registers and write circuits simultaneously operate by simultaneously activating the banks #A and #B. Thus, it is possible to simultaneously write test data in the banks #A and #B.

While the above description has been made with reference to two banks, the number of the banks is not restricted to two but four or more banks may be provided. Further, the number of data input/output terminals is not restricted to 8.

According to the present invention, as hereinabove described, it is possible to simultaneously test a plurality of memory cells by compressing the memory cell data in a test mode, thereby extremely reducing the test time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device taking in external signals in synchronization with a clock signal formed of a series of pulses, said synchronous semiconductor device comprising:

a data output terminal;

read means for simultaneously reading data from a predetermined plurality of memory cells in response to a read mode command incorporated in synchronization with said clock signal for successively transferring said data to said data output terminal; and compression means for carrying out a prescribed logical operation on said data read by said read means from said plurality of memory cells in response to a test mode designating signal for compressing said data to one-bit data and externally outputting the same.

2. A synchronous semiconductor memory device incorporating external signals in synchronization with a clock signal formed of a series of pulses, said synchronous semiconductor memory device comprising:

a plurality of data output terminals;

a plurality of read means provided corresponding to said plurality of data output terminals for simultaneously reading data from a predetermined plurality of memory cells in response to a read mode command incorporated in synchronization with said clock signal each for successively transferring said data to a corresponding data output terminal in response to said clock signal;

a plurality of compression means each provided corresponding to a respective read means for carrying out a prescribed logical operation on said data read by a corresponding read means from said predetermined plurality of memory cells thereby compressing said data to one-bit data; and output means for generating outputs of each respective compression means to said corresponding data output terminal.

3. A synchronous semiconductor memory device incorporating external signals in synchronization with a clock signal formed of a series of pulses, said synchronous semiconductor memory device comprising:

a plurality of data output terminals;

a plurality of read means provided corresponding to said plurality of data output terminals for simultaneously reading data from a predetermined plurality of memory cells in response to a read mode command incorporated in synchronization with said clock signal;

compression means for carrying out a prescribed logical operation on said data read by said plurality of read means from said memory cells for compressing said data to one-bit data; and output means for generating an output of said compression means to a particular one of said plurality of data output terminals.

4. A synchronous semiconductor memory device incorporating external signals in synchronization with a clock signal formed of a series of pulses, said synchronous semiconductor memory device comprising:

a plurality of banks each having a memory cell array;

activation means provided for the plurality of banks for activating and precharging each memory array of said plurality of banks on a bank by bank basis;

a data output terminal provided in common for said plurality of banks;

read means provided for each of said plurality of banks for simultaneously reading data from a predetermined plurality of memory cells of the memory cell array corresponding to one of said plurality of banks in response to a read mode command incorporated in synchronization with said clock signal for successively transferring said data to said data output terminal in response to said clock signal;

a plurality of first compression means provided corresponding to the banks and each said first compression means for carrying out a prescribed logical operation on said data read by corresponding read means from said plurality of memory cells in an activated bank for compressing said data to one-bit data; and second compression on outputs for carrying out another prescribed logical operation on outputs of said plurality of first compression means for compressing said outputs to one-bit data and externally outputting the same to said data output terminal.

5. A synchronous semiconductor memory device incorporating external signals in synchronization with a clock signal formed of a series of pulses, said synchronous semiconductor memory device comprising:

a plurality of banks each having a memory cell array;

activation means provided corresponding to the banks and for activating and precharging corresponding memory arrays, on a bank by bank basis;

a plurality of data output terminals shared by said plurality of banks;

a plurality of read means provided corresponding to said plurality of data output terminals in each said bank for simultaneously reading data from a predetermined plurality of memory cells of the memory cell array corresponding to one of said plurality of banks in response to a read mode command incorporated in synchronization with said clock signal for successively transferring said data to said plurality of data output terminals in response to said clock signal;

a plurality of first compression means provided corresponding to the respective banks for carrying out a first logical operation on said data read by each of said plurality of read means from said predetermined plurality of memory cells in each said bank for compressing said data to one-bit data; and second compression means for carrying out a second logical operation on outputs of said plurality of first compression means for compressing said outputs to one-bit data and externally outputting the same.

6. A synchronous semiconductor memory device incorporating external signals including address signals and control signals in synchronization with a clock signal formed of a series of pulses, said synchronous semiconductor memory device comprising:

a plurality of banks each including a memory cell array with each memory cell array having a plurality of memory cells, each bank including means for selecting a memory cell designated by an address signal incorporated in synchronization with said clock signal;

first activation means responsive to a bank address signal designating a bank incorporated in synchronization with said clock signal for activating a bank designated by said bank address signal, independently of the states of activation and precharging of remaining banks in a normal mode of operation, and second activation means for simultaneously activating said plurality of banks in response to a test mode designating signal.

7. A semiconductor memory device incorporating external signals including address signals and control signals in synchronization with a clock signal formed of a series of pulses, said synchronous semiconductor memory device comprising:

a memory cell array having a plurality of memory cells;

read means for simultaneously reading data of a prescribed number of memory cells from said memory cell array;

a first wired circuit having a plurality of n-channel insulated gate type field effect transistors each having a gate receiving each respective data read by said read means from said prescribed number of memory cells, said plurality of n-channel insulated gate type field effect transistors being connected between a first signal line and a first potential node in parallel with each other;

a second wired circuit provided separately from said first wired circuit and having a plurality of p-channel insulated gate type field effect transistors each having a gate receiving each respective data read by said read means from said prescribed number of memory cells, said p-channel insulated gate type field effect transistors connected between a second signal line and a second potential node in parallel with each other; and logic means coupled to receive signals on said first and second signal lines for carrying out a prescribed logic operation on outputs of said first and second wired circuits.

8. The device according to claim 7, wherein said first wired circuit further includes a p channel precharge transistor responsive to a precharge enable signal for precharge said first signal line to an operating power supply potential level, and a first latch means responsive to said precharge enable signal being inactive for latching a signal on said first signal line, and wherein said second wired circuit further includes an n channel precharge transistor responsive to said precharge enable signal for precharging said second signal line to a ground potential level, and a second latch means responsive to said precharge enable signal being inactive for latching a signal on said second signal line, and wherein said logic means includes gate means for determining that an output of said first latch means is coincident in logic with an output of said second latch means to generate a pass signal indicating that all the prescribed number of memory cells are good.

9. A synchronous type semiconductor memory device operating in synchronization with a clock signal, comprising:

data output means for externally supplying received data in synchronization with said clock signal;

a memory cell array having a plurality of memory cells;

selection means responsive to an address signal received in synchronization with said clock signal for simultaneously selecting a predetermined number of said memory cells in said memory cell array, said predetermined number being a multiple of a number of data bits which said data output means can externally supply at a time;

read means responsive to a read mode designating signal received in synchronization with said clock signal for simultaneously reading and storing data of said predetermined number of memory cells selected by said selection means; and compression means responsive to a test mode designating signal designating a test mode of operation for compressing the data of the predetermined number of cells stored in said read means to a one-bit data indicating whether or not a defective memory cell is included in said predetermined number of memory cells for external outputting.

10. The device according to claim 9, wherein said data output means includes a data output terminal and an output buffer for buffering a received data signal and supplying the buffered received data signal to said data output terminal, and wherein said read means includes a plurality, equal to said predetermined number, of read registers provided respectively to said predetermined number of memory cells for storing data of corresponding memory cells.

11. The device according to claim 10, wherein said compression means supplies said one-bit data to said output buffer.

12. The device according to claim 10, wherein said compression means supplies said one-bit data to a pin terminal different from said data output terminal.

13. The device according to claim 9, wherein said compression means includes;
gate means responsive to a precharge enable signal being inactive for generating test data corresponding to the data stored in said read means,
first wired circuit including a plurality of first conductivity type field effect transistors provided respectively for said test data and having gates receiving corresponding test data and provided between a first signal line and a first fixed potential node in parallel with each other, and a second conductivity type field effect transistor responsive to said precharge enable signal for precharging said first signal line to a second fixed potential,
a second wired circuit including a plurality of second conductivity type field effect transistor provided respectively for said test data and having gates receiving corresponding test data and provided between a second signal line and a second fixed potential node in parallel with each other, and a precharge transistor of the first conductivity type for precharging said second signal line to the fixed potential of said first fixed potential node in response to said precharge enable signal, and
generation means responsive to said precharge enable signal being inactive for determining whether signal potentials on said first and second signal lines are identical in logic to each other to generate said one-bit data indicating the result of determination.

14. The device according to claim 13, wherein said precharge enable signal is made inactive when said read mode designating signal is applied and after said read means stores data of the predetermined number of memory cells.

15. The device according to claim 13, wherein said gate means includes a first gate responsive to said precharge enable signal for generating a signal turning off said plurality of first conductivity type field effect transistors, and a second gate responsive to said precharge enable signal for generating a signal turning off said plurality of second conductivity type field effect transistors.

16. The device according to claim 9, wherein said output means includes a plurality of data output terminals, and a plurality of output buffers provided respectively for said plurality of data output terminals, and wherein said read means includes a prescribed number of data registers for each of said plurality of output buffers, said prescribed number being equal to said predetermined number divided by the factor of said multiple, and wherein said compression means includes a plurality of compressors provided to each of said prescribed number of read registers, each of said plurality of compressors compressing data stored in corresponding read registers of said prescribed number into a one-bit data.

17. The device according to claim 16, wherein said plurality of compressors supplies respective one-bit data to corresponding output buffers for external supply through corresponding data output terminals.

18. The device according to claim 16, wherein said compression means further includes a compressing unit for compressing outputs of said plurality of compressors into a final one-bit data to be externally supplied.

19. The device according to claim 18, wherein said compressing unit includes gate means receiving said outputs of said plurality of compressors in parallel for performing a predetermined logical operation on the received outputs to generate said final one-bit data indicating logical matching of the received outputs.

20. The device according to claim 19, wherein said predetermined logical operation is a logical product operation.

21. The device according to claim 18, wherein said compressing unit includes a plurality of cascaded logic gates each provided for a predetermined set of compressors of said plurality of compressors and each for compressing outputs of a corresponding set of compressors to a one-bit data for transference to a subsequent logic gate.

22. The device according to claim 18, wherein said compressing unit includes a plurality of first gates each provided for a predetermined set of compressors of said plurality of compressors and each for compressing outputs of a corresponding set of compressors into a one-bit data, and a second gate receiving outputs of said plurality of gates for compressing the received outputs to the final one-bit data.

23. The device according to claim 18, further comprising switch means responsive to said test mode designating signal for transferring said final one-bit data to all said plurality of output buffers.

24. The device according to claim 18, further comprising means responsive to said test mode designating signal for supplying said final one-bit data to a particular one of said plurality of output buffers.

25. The device according to claim 18, further comprising a terminal provided separately from said plurality of data terminals, for receiving said final one-bit data from said compressing unit.

26. The device according to claim 9, wherein said output means includes a plurality of data output terminals, and a plurality of output buffers provided respectively to said plurality of data output terminals, and wherein said read means includes a prescribed number of data registers for each of said plurality of output buffers, said prescribed number being equal to said predetermined number divided by the factor of said multiple, and wherein said compression means includes a compressor receiving outputs of all of said prescribed number of data registers in parallel, for converting the received outputs to the one-bit data.

27. The device according to claim 26, wherein an output of said compressor is supplied to a particular one of said plurality of output buffers.

28. The device according to claim 9, further comprising,
another memory cell array being identical in arrangement to said memory cell array,
another data output means identical in structure to said data output means,
another selection means identical in structure to said selection means,
another read means being identical in structure to said read means,
another compression means, identical in structure to said compression means, and
compressor responsive to said test mode designating signal for compressing outputs of said compression means and said another compression means into the one-bit data.

29. The device according to claim 27, wherein elements associated with said memory cell array and elements associated with said another memory array respectively form banks each accessed on a bank by bank basis, and wherein said synchronous type semiconductor memory device further comprises means responsive to said test mode designating signal for activating all said banks.

30. The device according to claim 28, wherein said data output means and said another data output means share a data output terminal supplying an external data.

31. The device according to claim 9, further comprising data input means for receiving externally applied data to generate internal write data in synchronization with said clock signal, and data write means responsive to a write mode designating signal applied in synchronization with said clock signal for transferring data received from said data input means onto said predetermined number of memory cells selected by said selection means, said data write means including means responsive to said test mode designating signal for simultaneously transferring the data received from input means to said predetermined number of memory cells.

32. The device according to claim 31, wherein said data input means includes a plurality of data input terminals, and a plurality of input buffers provided respectively to said plurality of data input terminals, and said data write means includes a prescribed number of write registers provided per the input buffer, and means responsive to said test mode designating signal for simultaneously activating all said prescribed number of write registers for each said input buffer.

33. The device according to claim 32, wherein said data write means includes means responsive to said test mode designating signal for transferring data received from a particular one of said plurality of input buffers to all said prescribed number of write registers for each said input buffer simultaneously.

* * * * *

(12) EX PARTE REEXAMINATION CERTIFICATE (9683rd)
United States Patent
Sawada et al.

(10) Number: US 5,511,029 C1
(45) Certificate Issued: May 31, 2013

(54) TEST CIRCUIT IN CLOCK SYNCHRONOUS SEMICONDUCTOR MEMORY DEVICE

(75) Inventors: Seiji Sawada, Hyogo (JP); Yasuhiro Konishi, Hyogo (JP)

(73) Assignee: Dram Memory Technologies LLC, Newport Beach, CA (US)

Reexamination Request:
No. 90/012,146, Feb. 16, 2012

Reexamination Certificate for:
| | |
|---|---|
| Patent No.: | 5,511,029 |
| Issued: | Apr. 23, 1996 |
| Appl. No.: | 08/246,582 |
| Filed: | May 19, 1994 |

(30) Foreign Application Priority Data

May 25, 1993 (JP) ........................................ 5-122439

(51) Int. Cl.
| | |
|---|---|
| *G11C 29/26* | (2006.01) |
| *G11C 29/04* | (2006.01) |
| *G11C 29/40* | (2006.01) |

(52) U.S. Cl.
USPC ................. 365/201; 365/189.05; 365/230.03; 365/233.1; 365/233.14

(58) Field of Classification Search
None
See application file for complete search history.

(56) References Cited

To view the complete listing of prior art documents cited during the proceeding for Reexamination Control Number 90/012,146, please refer to the USPTO's public Patent Application Information Retrieval (PAIR) system under the Display References tab.

*Primary Examiner* — Linh M. Nguyen

(57) ABSTRACT

In order to reduce a test time for a synchronous type memory device, a compression circuit compresses a plurality of memory cell data which are inputted in a plurality of read registers provided for a data output terminal to 1-bit data. A bank selection circuit selects an output of the compression circuit of either a bank #A or a bank #B. A tristate inverter buffer passes the 1-bit compression data selected by the bank selection circuit in accordance with a test mode command signal. The data output terminal outputs compressed data of a plurality of bits of memory cells. Thus, it is possible to simultaneously determine pass/fail of a plurality of memory cells, thereby reducing the test time.

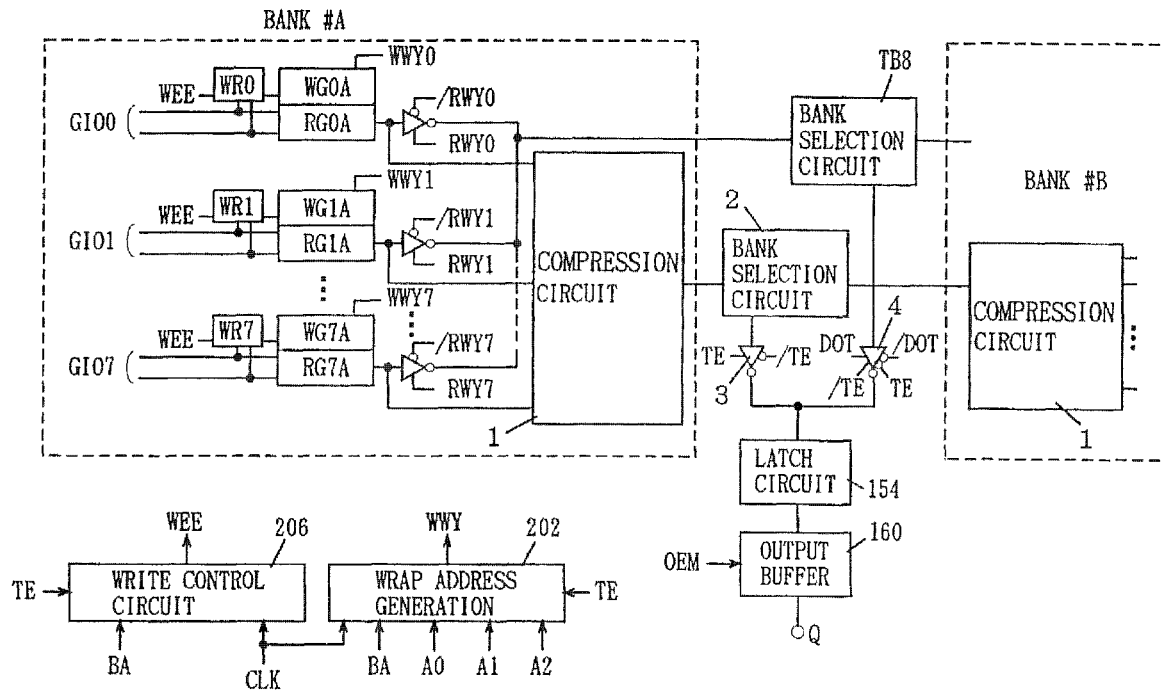

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-33 are cancelled.

\* \* \* \* \*